US009947738B2

(12) United States Patent
Kondoh et al.

(10) Patent No.: US 9,947,738 B2
(45) Date of Patent: Apr. 17, 2018

(54) DISPLAY PANEL INCLUDING MULTILAYER WIRING AND MEMBER FOR REDUCING PROBABILITY OF POWER LINE MIS-PRESSING DURING MANUFACTURING PROCESS, AND MANUFACTURING METHOD FOR THE SAME

(71) Applicant: JOLED INC., Tokyo (JP)

(72) Inventors: Tetsuro Kondoh, Tokyo (JP); Toshiaki Onimaru, Tokyo (JP); Makoto Kimura, Hyogo (JP); Kazuhiro Kobayashi, Kanagawa (JP); Yoshiki Hayashida, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/969,439

(22) Filed: Dec. 15, 2015

(65) Prior Publication Data

US 2016/0172429 A1    Jun. 16, 2016

(30) Foreign Application Priority Data

Dec. 16, 2014    (JP) ................................ 2014-253821

(51) Int. Cl.
*H01L 29/08*    (2006.01)
*H01L 27/32*    (2006.01)

(52) U.S. Cl.
CPC ...... *H01L 27/3276* (2013.01); *H01L 27/3246* (2013.01); *H01L 27/3262* (2013.01)

(58) Field of Classification Search
CPC ............ H01L 27/3246; H01L 27/3262; H01L 27/3276; H01L 51/56

USPC .............................................. 257/40, 59, 72
See application file for complete search history.

(56) References Cited

U.S. PATENT DOCUMENTS

| 5,443,922 A | 8/1995 | Nishizaki et al. |
| 6,992,332 B2* | 1/2006 | Yamazaki ........... H01L 27/3246 257/59 |
| 8,823,254 B2 | 9/2014 | Ohta et al. |
| 2003/0090447 A1* | 5/2003 | Kimura ................ G09G 3/3241 345/82 |
| 2009/0128017 A1 | 5/2009 | Sagawa et al. |

FOREIGN PATENT DOCUMENTS

| JP | 05-163488 | 6/1993 |
| JP | 2009-123538 | 6/2009 |

* cited by examiner

*Primary Examiner* — Hung Vu
(74) *Attorney, Agent, or Firm* — Greenblum & Bernstein, P.L.C.

(57) ABSTRACT

A display panel including: a substrate; a multi-layer wiring layer disposed over the substrate and including a first power line and a second power line; organic electroluminescence elements over the multi-layer wiring layer; a partition wall over the multi-layer wiring layer; and a member over the multi-layer wiring layer, a height of the member from the substrate being greater than a height of the partition wall from the substrate, wherein the multi-layer wiring layer includes a first portion and a second portion, the organic electroluminescence elements are arrayed on the first portion, in the second portion, the first power line and the second power line intersect, and the member is positioned on the second portion without overlapping at least one of the first power line and the second power line in plan view of the substrate.

11 Claims, 11 Drawing Sheets

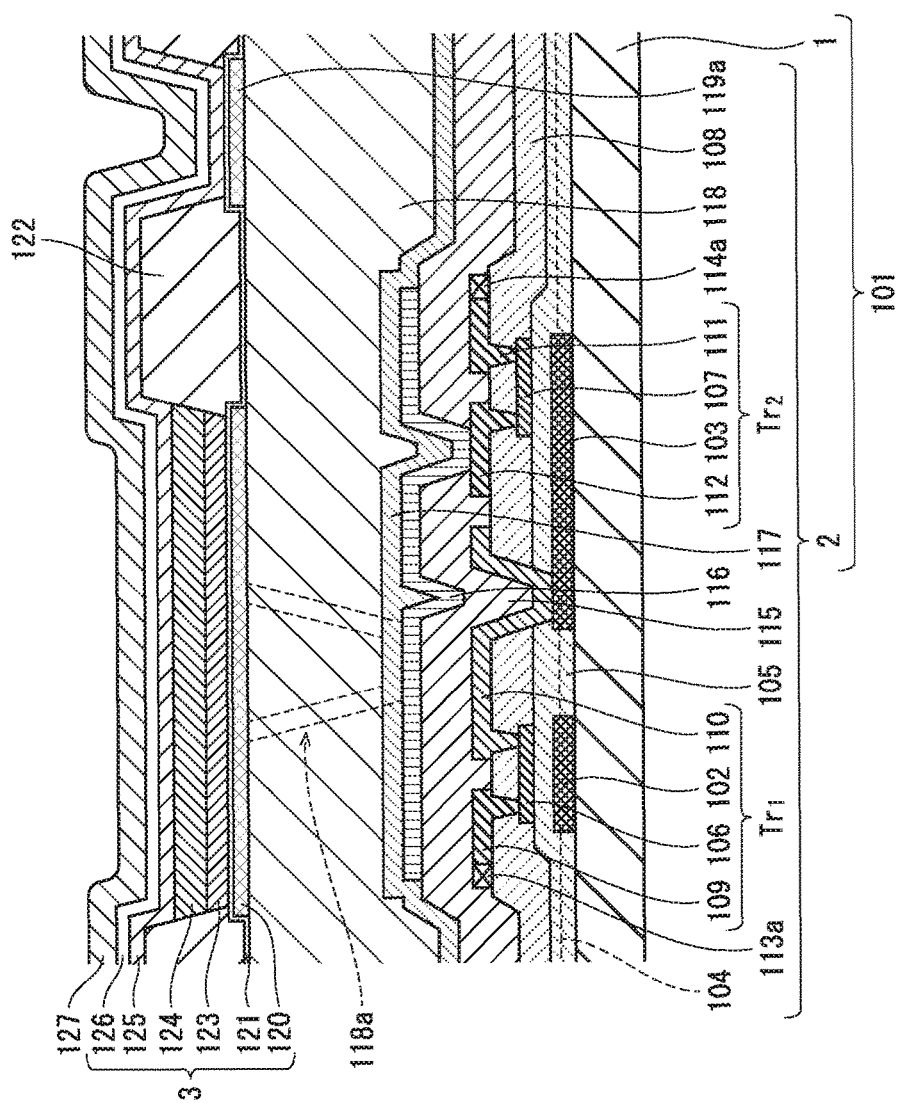

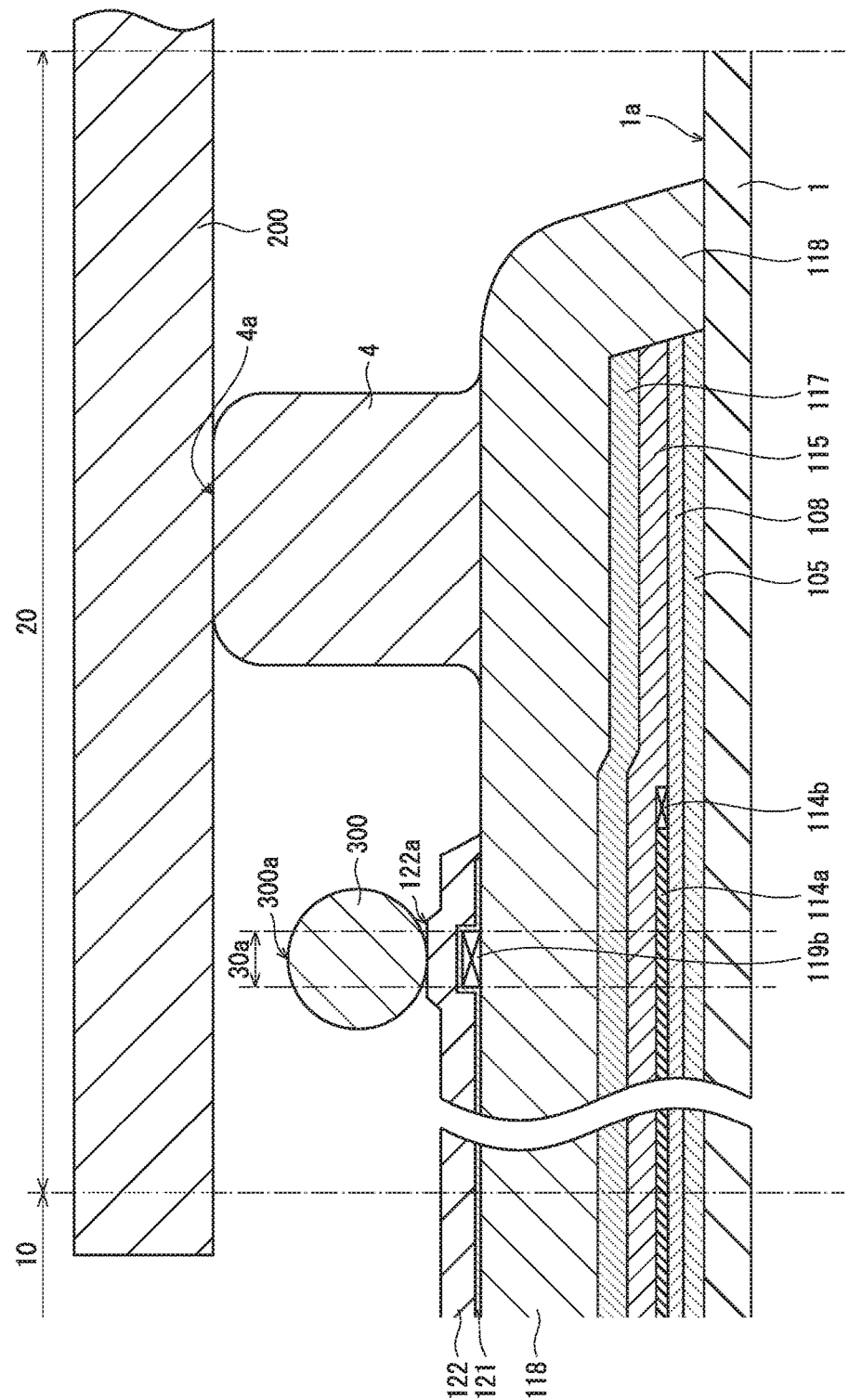

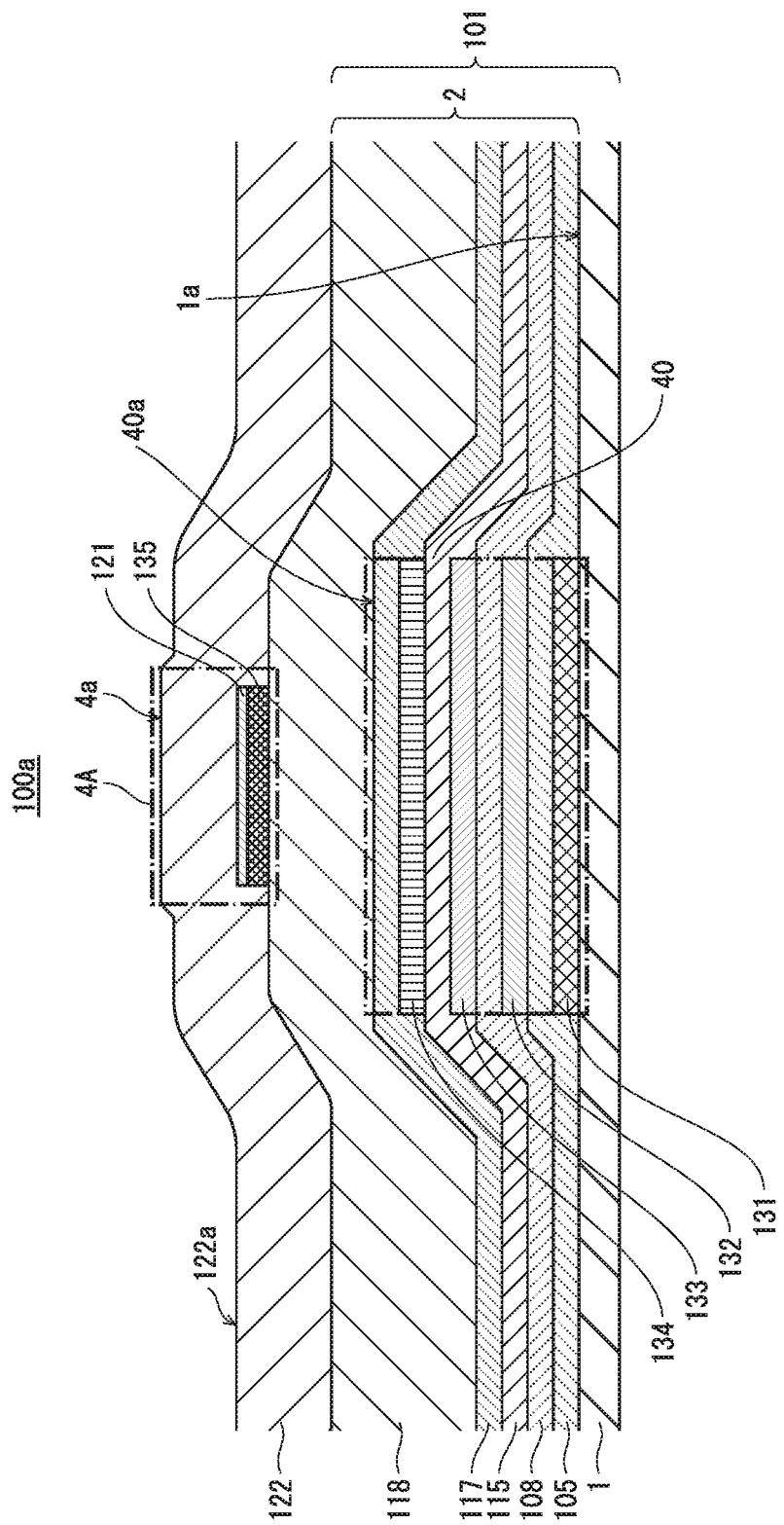

FIG. 11A
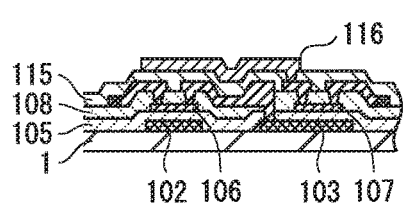 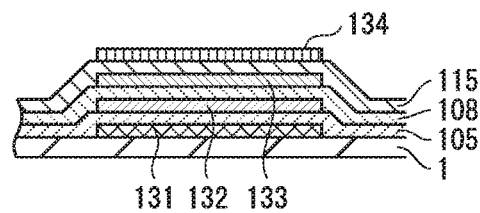
FIG. 11B
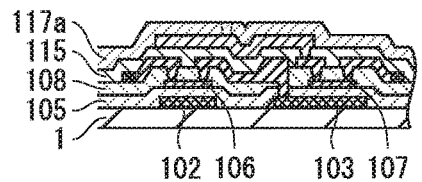 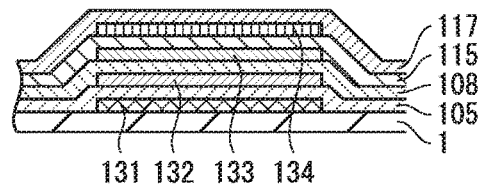
FIG. 11C
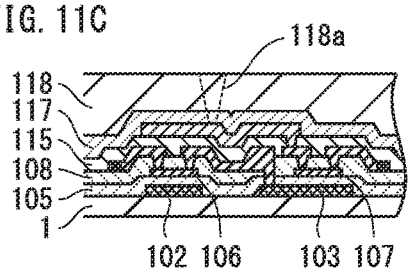 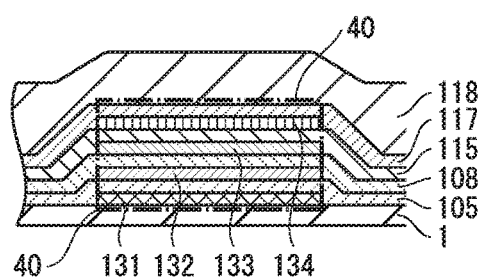
FIG. 11D
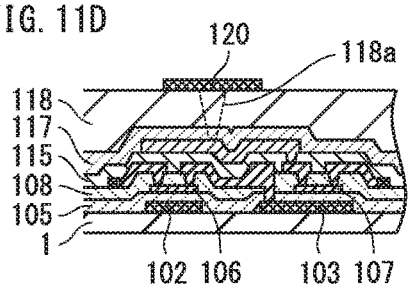 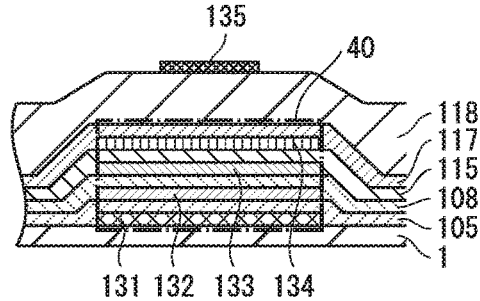
FIG. 11E
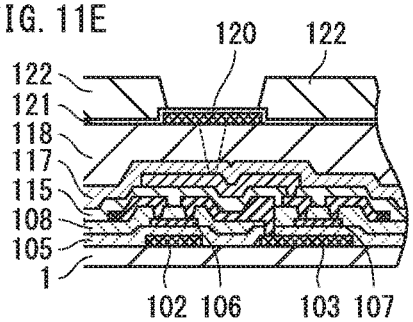 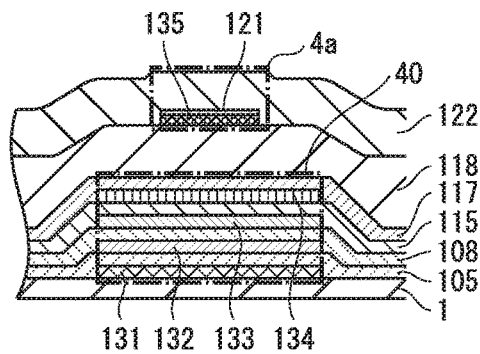

DISPLAY PANEL INCLUDING MULTILAYER WIRING AND MEMBER FOR REDUCING PROBABILITY OF POWER LINE MIS-PRESSING DURING MANUFACTURING PROCESS, AND MANUFACTURING METHOD FOR THE SAME

This application is based on an application No. 2014-253821 filed in Japan, the contents of which are hereby incorporated by reference.

BACKGROUND OF THE DISCLOSURE (1) Technical Field

The present disclosure pertains to a display panel and to a manufacturing method for the display panel.

(2) Description of Related Art

Conventionally, an organic electroluminescence display panel using an organic electroluminescence element is widely known. The organic electroluminescence display panel includes, for example, a substrate, a multi-layer wiring layer arranged on the substrate, and a plurality of organic electroluminescence elements arranged in a matrix on the multi-layer wiring layer.

The organic electroluminescence elements each include a lower electrode, an upper electrode, and an organic light-emitting layer sandwiched therebetween. A hole injection layer, a hole transport layer, an electron block layer, an electron injection layer, an electron transport layer, a hole block layer, and so on are provided as needed, positioned at one of between the lower electrode and the organic light-emitting layer and between the upper electrode and the organic light-emitting layer. Also, when the material for the organic electroluminescence element varies across pixels of different colors (e.g., red, green, and blue), a partition wall is provided to define regions in which the organic light-emitting layers for neighboring organic electroluminescence elements are to be provided. Each organic light-emitting layer is formed in one of the regions defined by the partition wall.

The multi-layer wiring layer includes a first power line connected to the lower electrodes of the organic electroluminescence elements and a second power line connected to the upper electrodes of the organic electroluminescence elements. The first power line may be positive while the second power line is negative, and the opposite configuration may also be used. In plan view of the display panel, the first power line and the second power line are each drawn from a region in which the organic electroluminescence elements are arranged (hereinafter termed a display region) to a surrounding region (hereinafter termed a frame region) and connect to a drive circuit in the frame region (see Japanese Patent Application Publication No. 2009-123538).

SUMMARY OF THE DISCLOSURE

The present disclosure aims to provide a display panel reducing the probability of mis-pressing occurring, during a manufacturing process, at a position in a multi-layer wiring layer where a first power line and a second power line appear to intersect in plan view but are not in physical contact in with one another (such intersection may be referred to in the present disclosure as intersection without direct contact or intersection), and to provide a manufacturing method therefor.

In view of this, one aspect of the present disclosure is a display panel, including: a substrate; a multi-layer wiring layer over the substrate, the multi-layer wiring layer including a first power line receiving a first electric potential and a second power line receiving a second electric potential differing from the first electric potential; organic electroluminescence elements over the multi-layer wiring layer, each of the organic electroluminescence elements including a first electrode electrically connected to the first power line, a second electrode electrically connected to the second power line, and an organic light-emitting layer sandwiched between the first electrode and the second electrode; a partition wall over the multi-layer wiring layer and between the organic electroluminescence elements; and a member over the multi-layer wiring layer, a height of a top portion of the member from a top face of the substrate being greater than a height of a top portion of the partition wall from the top face of the substrate, wherein the multi-layer wiring layer includes a first portion and a second portion that, in plan view of the substrate, surrounds the first portion, the organic electroluminescence elements are arrayed on a top face of the first portion, in the second portion, the first power line and the second power line intersect without direct contact, and the member is positioned on the second portion without overlapping at least one of the first power line and the second power line in plan view of the substrate.

The display panel configured as described above reduces the probability of mis-pressing occurring, during the manufacturing process, at the position in the multi-layer wiring layer where the first power line and the second power line intersect without direct contact.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific Embodiment of the technology pertaining to the present disclosure.

FIG. 2 is a partial cross-sectional diagram illustrating an overall configuration of the display panel in a display region.

FIG. 6A is a diagram illustrating a state in which the multi-layer wiring layer has been formed. FIG. 6B is a diagram illustrating a state in which a pixel electrode has been formed over the multi-layer wiring layer. FIG. 6C is a diagram illustrating a state in which a hole injection layer has been formed. FIG. 6D is a diagram illustrating a state in which a partition wall has been formed. FIG. 6E is a diagram illustrating a state in which the mask-holding member has been formed in the frame region.

FIG. 7 is a schematic diagram illustrating a state during a deposition process of an electron transport layer, in which a mask is in contact with the frame region.

FIG. 9 is a partial cross-sectional diagram illustrating the overall configuration of the display panel pertaining to the Embodiment 2 in the frame region, in a cross-section taken along line D-D in FIG. 8.

FIG. 10A is a diagram illustrating a substrate. FIG. 10B is a diagram illustrating a state in which a gate electrode has been formed over the substrate in the display region, and a gate electrode material layer has been formed over the substrate in the frame region. FIG. 10C is a diagram illustrating a state in which a gate insulation layer has been formed. FIG. 10D is a diagram illustrating a state in which a channel layer has been formed over the gate insulation layer in the display region, and a channel material layer has been formed over the gate insulation layer in the frame region. FIG. 10E is a diagram illustrating a state in which a channel protection layer has been formed in the display region and the frame region. FIG. 10F is a diagram illustrating a state in which a drain electrode and a source electrode have been formed over the channel protection layer in the display region, and a source-drain electrode material layer has been formed over the channel protection layer in the frame region. FIG. 10G is a diagram illustrating a state in which a lower passivation layer has been formed in the display region and the frame region.

FIGS. 11A through 11E are schematic diagrams illustrating the manufacturing method of the display panel pertaining to the Embodiment 2, until the formation of the mask-holding member. FIG. 11A is a diagram illustrating a state in which an intermediate electrode has been formed over the lower passivation layer in the display region, and an intermediate electrode material layer has been formed over the lower passivation layer in the frame region. FIG. 11B is a diagram illustrating a state in which an upper passivation layer has been formed in the display region and the frame region. FIG. 11C is a diagram illustrating a state in which an inter-layer insulation layer has been formed in the display region and the frame region. FIG. 11D is a diagram illustrating a state in which a branch portion of a negative electrode power line and a pixel electrode for the organic electroluminescence element have been formed in the display region, and a power line wiring material layer for the mask-holding member has been formed in the frame region. FIG. 11E is a diagram illustrating a state in which a hole injection layer and the partition wall have been formed in the display region and the frame region.

DESCRIPTION OF EMBODIMENTS

Background Leading to Invention

Figure 1A:
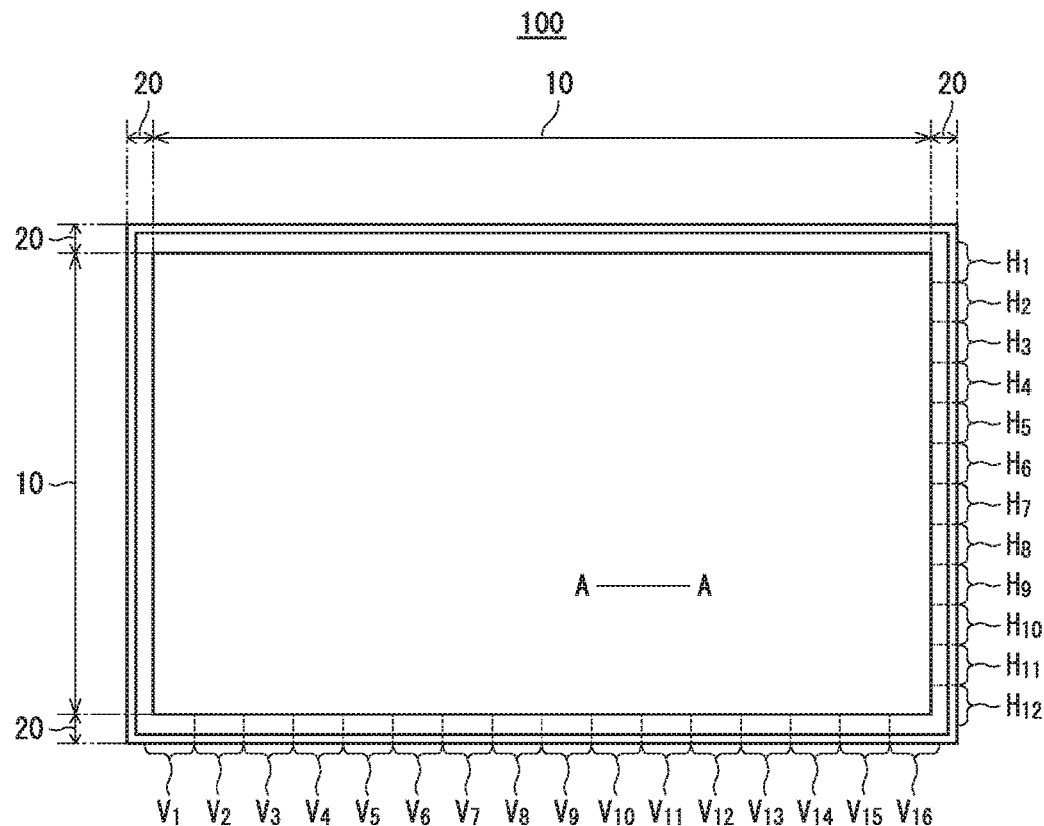
FIG. 1A is a plan view layout diagram of a display panel pertaining to Embodiment 1.

A typical organic electroluminescence element includes layers deposited using one of a vapor deposition method, a sputtering method, a chemical vapor deposition (hereinafter, CVD) method, and an atomic layer deposition (hereinafter, ALD) method, after the formation of a partition wall and an organic light-emitting layer. These deposition methods typically involve using a mask so that material for the layer being formed is accumulated only at a target position. For example, when an electron transport layer is to be formed in a display region and is not to be formed in a frame region, a mask having a frame shape is used to cover the frame region. Performing deposition with the mask in contact with the top of a multi-layer wiring layer of the display panel enables the electron transport layer to be formed only in the display region.

However, in some cases, a foreign object may unintentionally adhere to the multi-layer wiring layer during the manufacturing process of the display panel. The foreign object may be, for example, dust or dirt floating in the atmosphere, particulate matter originating in the manufacturing device or the manufacturing process, or the like. Placing the mask in contact with the top of the multi-layer wiring layer with the foreign object adhering thereto poses a risk of the multi-layer wiring layer being locally pressed in an undesirable manner (hereinafter also termed mis-pressing) by the foreign object, with a particularly negative effect on display panel performance.

In a typical multi-layer wiring layer, a first power line and a second power line intersect without direct contact in the frame region. For example, Japanese Patent Application Publication No. 2009-123538 discloses a multi-layer wiring layer whose second power line includes branch portions forming a mesh pattern in the display region and a main portion forming a loop in the frame region, in order to constrain fluctuations in potential applied to the organic electroluminescence elements. Further, the multi-layer wiring layer disclosed in Japanese Patent Application Publication No. 2009-123538 includes a first power line that intersects, without direct contact, the main portion of the second power line, is drawn outwards beyond the main portion of the second power line, and is connected to a drive circuit. Mis-pressing occurring at the site of this intersection causes the distance between the first power line and the second power line to decrease, and leads to a risk of decreased potential resistance and of increased leak current. Also, in the worst-case scenario, short-circuiting may occur between the first power line and the second power line.

Meanwhile, when making a configuration where one of the electrodes of the organic electroluminescence element is a common electrode connected to a plurality of the organic electroluminescence elements and power is supplied to the common electrode by the second power line, there is no need for the second power line to be drawn between the organic electroluminescence elements. However, even when making such a configuration, the first power line and the second power line intersect without direct contact in the frame region. Thus, the problems occurring when mis-pressing occurs at a position where the first power line and the second power line intersect without direct contact in the configuration disclosed in Japanese Patent Application Publication No. 2009-123538 are not overcome.

In consideration of the above-described problems, a display panel reducing the probability of mis-pressing occurring, during the manufacturing process, at a position where the first power line and the second power line intersect without direct contact in the multi-layer wiring layer, and a manufacturing method therefor are considered.

Aspects of the Disclosure

One aspect of the present disclosure is a display panel, including: a substrate; a multi-layer wiring layer over the substrate, the multi-layer wiring layer including a first power line receiving a first electric potential and a second power line receiving a second electric potential differing from the first electric potential; organic electroluminescence elements over the multi-layer wiring layer, each of the organic electroluminescence elements including a first electrode electrically connected to the first power line, a second electrode electrically connected to the second power line, and an organic light-emitting layer sandwiched between the first electrode and the second electrode; a partition wall over the multi-layer wiring layer and between the organic electroluminescence elements; and a member over the multi-layer wiring layer, a height of a top portion of the member from a top face of the substrate being greater than a height of a top portion of the partition wall from the top face of the substrate, wherein the multi-layer wiring layer includes a first portion and a second portion that, in plan view of the substrate, surrounds the first portion, the organic electroluminescence elements are arrayed on a top face of the first portion, in the second portion, the first power line and the second power line intersect without direct contact, and the member is positioned on the second portion without overlapping at least one of the first power line and the second power line in plan view of the substrate.

Typically, a mask used for the vapor deposition method, the sputtering method, the CVD method, and the ALD method includes a frame-shaped portion corresponding to the second portion of the multi-layer wiring layer (corresponding to the frame region of the display panel). According to the above-described configuration, the member is provided over the second portion of the multi-layer wiring layer. Thus, the mask comes into contact with the member when an intermediate product of the display panel is covered with the mask.

Accordingly, when a foreign object unintentionally adhering to the multi-layer wiring layer is sufficiently small, that is, where a height of a top portion of the foreign object is lower than the height of the top portion of the member, the mask does not come into contact with the foreign object. As such, localized mis-pressing does not occur at the position of the unintended foreign object. Also, when the height of the top portion of the foreign object is approximately equal to the height of the member top portion, the pressure from the mask is distributed across the foreign object and the member, thus relieving any mis-pressing caused by the foreign object. Further, short-circuiting between two power lines may occur when mis-pressing occurs at the position where the first power line intersects the second power line. However, the member is positioned in a region that does not overlap at least one of the first power line and the second power line, in plan view and that does not overlap the position where the first power line intersects the second power line. As such, the position where the first power line intersects the second power line is not subject to mis-pressing by the member. According to the above, the probability of mis-pressing occurring, during the manufacturing process, at the position where the first power line intersects the second power line in the multi-layer wiring layer is reduced, which reduces the risk of short-circuiting occurring between the first power line and the second power line.

Note that, the intermediate product indicates a state of the display panel during the manufacturing process thereof, prior to the formation of at least some layers configuring the organic electroluminescence elements.

In the display panel pertaining to one aspect of the present disclosure, the member may be positioned on the second portion without overlapping the first power line or the second power line in plan view of the substrate.

According to the above-described configuration, mis-pressing caused by the member is avoided in one or both of a region in the multi-layer wiring layer where the first power line is located and a region in the multi-layer wiring layer where the second power line is located, despite any mis-pressing of the multi-layer wiring layer at a position where the member is provided upon contact between the mask and the member. Thus, this enables changes in resistivity and interruption due to mis-pressing to be avoided for the first power line and the second power line.

In the display panel pertaining to one aspect of the present disclosure, the multi-layer wiring layer may further include signal lines transporting signals for setting the brightness of the organic electroluminescence elements, and the member may be positioned on the second portion without overlapping the first power line, the second power line, or the signal lines in plan view of the substrate.

According to the above-described configuration, mis-pressing caused by the member is avoided in regions in the multi-layer wiring layer where the signal lines are located, despite any mis-pressing of the multi-layer wiring layer at a position where the member is provided upon contact between the mask and the member. This enables changes in resistivity and interruption due to mis-pressing to be avoided for the signal lines.

In the display panel pertaining to one aspect of the present disclosure, the multi-layer wiring layer may further include signal lines transporting signals for setting the brightness of the organic electroluminescence elements, in the second portion, each of the signal lines may intersect, without direct contact, the first power line and the second power line, and the member may be positioned on the second portion without overlapping where the first power line and the signal lines intersect without direct contact, and where the second power line and the signal lines intersect without direct contact, in plan view of the substrate.

According to the above-described configuration, mis-pressing caused by the member is avoided at the positions where the signal lines intersect the first power line and the second power line, despite any mis-pressing of the multi-layer wiring layer at a position where the member is provided upon contact between the mask and the member. According to the above, the probability of mis-pressing occurring, during the manufacturing process, at positions in the multi-layer wiring layer where the signal lines intersect the first power line and the second power line may be reduced. As such, the probability of short-circuiting between the signal lines, the first power line, and the second power line may be reduced.

In the display panel pertaining to one aspect of the present disclosure, the member may be provided in plurality, and the members may be separated from one another on the second portion.

According to the above-described configuration, the member is provided in plurality. The first power line and the second power line are thus disposed between the members, in plan view of the substrate. As such, the positions where the members are provided do not overlap where the first power line and the second power line are arranged, in plan view of the substrate. Also, providing a plurality of members that are separated from one another enables stable contact with the mask.

In the display panel pertaining to one aspect of the present disclosure, the multi-layer wiring layer may further include thin-film transistors that control light emission by the organic electroluminescence elements and that each include a plurality of layers disposed one on top of another, the multi-layer wiring layer may further include a mound portion below the member, the mound portion including the plurality of layers included in the thin-film transistors and having a flat top portion, and in the second portion, a height of a top face of the multi-layer wiring layer from the top face of the substrate may be greater where the mound portion is located than where the mount portion is not located.

According to the above-described configuration, the height of the top portion of the member relative to the top face of the multi-layer wiring layer is reduced, and the member can be easily formed so that the height of the top portion thereof, relative to the top face of the substrate, is higher than the height of the top portion of the partition wall, relative to the top face of the substrate.

In the display panel pertaining to one aspect of the present disclosure, in the second portion, the first power line may include a first wiring portion that, in plan view of the substrate, extends linearly from the first portion, in the second portion, the second power line may include a second wiring portion that, in plan view of the substrate, extends linearly from the first portion in parallel to the first wiring portion, and a third wiring portion that is connected to the second wiring portion and that, in plan view of the substrate, extends orthogonal to the second wiring portion, and the first wiring portion and the third wiring portion may be on different layers of the multi-layer wiring layer and intersect without direct contact in the second portion.

In the display panel pertaining to one aspect of the present disclosure, in the second portion, the first power line may include a fourth wiring portion that is connected to the first wiring portion and that, in plan view of the substrate, extends orthogonal to the first wiring portion, in the second portion, the second power line may include a fifth wiring portion that is connected to the third wiring portion and that, in plan view of the substrate, extends in parallel to the second wiring portion, and the fourth wiring portion and the fifth wiring portion may be disposed on different layers of the multi-layer wiring layer and intersect without direct contact in the second portion.

According to the above-described configurations, the first power line intersects the second power line in the second portion of the multi-layer wiring layer, and the member is provided so as to avoid the position of this intersection. Thus, the probability of mis-pressing occurring, during the manufacturing process, at the position where the first power line intersects the second power line is reduced.

One aspect of the present disclosure is a manufacturing method for a display panel on which a plurality of organic electroluminescence elements each including a first electrode, a second electrode, and an organic light-emitting layer sandwiched between the first electrode and the second electrode are arrayed, the manufacturing method including: forming a multi-layer wiring layer over a substrate, the multi-layer wiring layer including a first power line receiving a first electric potential and a second power line receiving a second electric potential differing from the first electric potential; forming the first electrode over the multi-layer wiring layer to be electrically connected to the first power line, and forming a partition wall over the multi-layer wiring layer, the partition wall defining a region where the organic light-emitting layer is to be formed; forming a member over the multi-layer wiring layer, a height of a top portion of the member from a top face of the substrate being greater than a height of a top portion of the partition wall from the top face of the substrate; forming the organic light-emitting layer in the region defined by the partition wall; and disposing a mask having an aperture corresponding at least to the region defined by the partition wall in contact with the member, and forming a functional layer at least in the region defined by the partition wall through the aperture, wherein the multi-layer wiring layer includes a first portion and a second portion that, in plan view of the substrate, surrounds the first portion, the organic electroluminescence elements are arrayed on a top face of the first portion, in the second portion, the first power line and the second power line intersect without direct contact, and the member is formed to be positioned on the second portion without overlapping at least one of the first power line and the second power line in plan view of the substrate.

According to the above-described configuration, the member is formed over the second portion of the multi-layer wiring layer, prior to the deposition of the functional layer. As such, the deposition of the functional layer can be performed by covering the intermediate product of the display panel with a mask, while the mask is in contact with the member. Accordingly, when a foreign object unintentionally adhering to the multi-layer wiring layer is sufficiently small, that is, where a height of a top portion of the foreign object is lower than the height of the top portion of the member, the mask does not come into contact with the foreign object. As such, localized mis-pressing does not occur at the position of the unintended foreign object. Also, when the height of the top portion of the foreign object is approximately equal to the height of the member top portion, the pressure from the mask is distributed across the foreign object and the member, thus relieving any mis-pressing caused by the foreign object. Further, the member is positioned in a region that does not overlap at least one of the first power line and the second power line, in plan view and that does not overlap the position where the first power line intersects the second power line. As such, the position where the first power line intersects the second power line is not subject to mis-pressing by the member. According to the above, the probability of mis-pressing occurring, during the manufacturing process, at the position where the first power line intersects the second power line in the multi-layer wiring layer is reduced.

Embodiments of a display panel pertaining to aspects of the present disclosure are described below, with reference to the drawings.

Embodiment 1

1. Display Panel Configuration

FIG. 1A is a plan view layout diagram of a display panel 100 pertaining to Embodiment 1. The display panel 100 includes a display region 10 and a frame region 20 surrounding the display region 10, in plan view.

A plurality of pixels are arrayed in a matrix within the display region 10. For example, when the display panel is a panel having 4K resolution, the matrix includes 3840 pixels per horizontal line and 2160 pixels per vertical line. Each pixel includes a plurality of sub-pixels each having a different color. In the present Embodiment, each pixel includes a red sub-pixel, a green sub-pixel, and a blue sub-pixel. Each sub-pixel is configured from one organic electroluminescence element.

The frame region 20 is a rectangular frame having partition regions $V_1$ through $V_{16}$ on a long side and partition regions $H_1$ through $H_{12}$ on a short side. Each of the partition regions $V_1$ through $V_{16}$ and $H_1$ through $H_{12}$ is electrically connected to an external drive circuit.

Figure 1B:
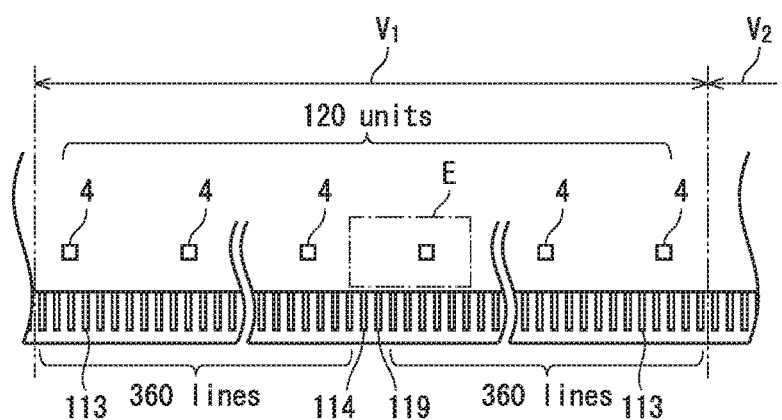
FIG. 1B is a magnified view of a partition region.

FIG. 1B illustrates an expanded view of partition region $V_1$. Partition region $V_1$ includes a positive electrode power line 114 serving as a first power line, a negative electrode power line 119 serving as a second power line, and a plurality of data signal lines 113. The first and second power lines are supplied with different electric potential. Furthermore, partition region $V_1$ is provided with a plurality of mask-holding members 4 separated from one another with spacing along the long side of the frame region 20.

Each of partition regions $V_2$ through $V_{16}$ is similar to partition region $V_1$. In each of the partition regions V, the positive electrode power line 114 and the negative electrode power line 119 supply electric power to organic electroluminescence elements in a plurality of pixels arranged along a plurality of vertical lines. For example, when the display panel 100 is a panel having 4K resolution and includes 16 of the partition regions V, each of the partition regions V supplies electric power from the positive electrode power line 114 and the negative electrode power line 119 to organic electroluminescence elements in pixels arranged along 240 vertical lines.

The data signal lines 113 each transport a voltage signal indicating brightness to a corresponding organic electroluminescence element, to which the positive electrode power line 114 and the negative electrode power line 119 supply electric power. When the display panel 100 is a panel having 4K resolution and includes 16 of the partition regions V, 720 of the data signal lines 113 are present in each partition region V.

Also, partition regions $H_1$ through $H_{12}$ are similar to partition regions $V_1$ through $V_{16}$, differing only in the type of wiring disposed therein. Specifically, each of the partition regions $H_1$ through $H_{12}$ includes a plurality of scan signal lines each transporting a select signal for selecting a horizontal line in the display region 10. Furthermore, each partition region H is provided with a plurality of mask-holding members 4 separated from one another with spacing along the short side of the frame region 20. When the display panel 100 is a panel having 4K resolution and includes 12 of the partition regions H, 180 of the scan signal lines are present in each partition region H.

Here, a horizontal line is selected by a scan signal line transporting the select signal. Further, the brightness of each of the organic electroluminescence elements arranged along the horizontal line so selected is set by a corresponding one of the data signal lines 113 transporting a voltage signal indicating brightness to the organic electroluminescence element. As such, the data signal lines 113 and the scan signal lines serve as signal lines transporting signals for setting the brightness of organic electroluminescence elements.

1.1. Display Region Configuration

FIG. 2 is a partial cross-sectional diagram illustrating the overall configuration of the display region 10 of the display panel 100. The cross-section depicted is taken along line A-A of FIG. 1A. The display region 10 of the display panel 100 includes a multi-layer wiring layer 2 and an organic electroluminescence element 3, layered in the stated order over a substrate 1. In FIG. 2, the range of only one organic electroluminescence element corresponding to one sub-pixel is depicted.

1.1.1. Substrate

The substrate 1 is formed from one of an inorganic material and an organic material. Specific examples of the material of the substrate 1 include, for example, insulating materials such as non-alkali glass, soda glass, non-fluorescent glass, phosphate glass, borate glass, quartz, acrylic resin, styrene resin, polycarbonate resin, epoxy resin, polyethylene, polyester, silicone resin, and aluminum oxide. An organic resin film may also be used.

1.1.2. Multi-layer Wiring Layer

A gate electrode 102 and a gate electrode 103 are formed on the substrate 1 with mutual spacing therebetween. The gate electrode 102 and the gate electrode 103 are formed from any of aluminum, aluminum alloy, copper, and copper alloy, for example. Also, the gate electrode 102 and the gate electrode 103 may have a single-layer configuration, namely one of an aluminum layer, an aluminum alloy layer, a copper layer, and a copper alloy layer, and may also have a layered configuration in which any one of these layers has another metal layer layered thereon. For example, any of a layered configuration of a copper layer and a titanium layer, a layered configuration of a copper layer and a molybdenum layer, and a layered configuration of an aluminum layer and a titanium layer may be used.

A scan signal line 104 is additionally formed over the substrate 1. The scan signal line 104 extends along a horizontal line of the display panel 100, is electrically connected to the respective gate electrodes 102 of all sub-pixels along the same horizontal line, and extends as far as the frame region 20.

A gate insulation layer 105 is formed so as to cover the gate electrode 102, the gate electrode 103, the scan signal line 104, and a surface of the substrate 1. The gate insulation layer 105 is formed from a known gate insulation body material such as silicon oxide (SiO).

A channel layer 106 is formed over the gate insulation layer 105, at a portion thereof corresponding to the gate electrode 102. Also, a channel layer 107 is formed over the gate insulation layer 105, at a portion thereof corresponding to the gate electrode 103.

A channel protection layer 108 is formed so as to cover the channel layer 106, the channel layer 107, and a surface of the gate insulation layer 105.

A drain electrode 109, a drain electrode 111, a source electrode 110, and a source electrode 112 are formed over the channel protection layer 108. The drain electrode 109 and the source electrode 110 are each electrically connected to the channel layer 106 through a contact hole passing through the channel protection layer 108. Likewise, the drain electrode 111 and the source electrode 112 are each electrically connected to the channel layer 107 through a contact hole passing through the channel protection layer 108. The drain electrode 109, the drain electrode 111, the source electrode 110, and the source electrode 112 are each formed from one of molybdenum, tungsten, vanadium, ruthenium, gold, copper, and an alloy of any of these metals.

A wiring portion 113a of one data signal line 113 and a branch portion 114a of the positive electrode power line 114 are additionally formed over the channel protection layer 108. The wiring portion 113a extends along a vertical line of the display panel 100, is electrically connected to the drain electrode 109 of the organic electroluminescence elements 3 of all sub-pixels along the same vertical line, and extends as far as the frame region 20. The branch portion 114a also extends along the vertical line of the display panel 100, is electrically connected to the drain electrode 111 of the organic electroluminescence elements 3 of all sub-pixels along the same vertical line, and extends as far as the frame region 20.

A lower passivation layer 115 is formed so as to cover the drain electrode 109, the drain electrode 111, the source electrode 110, the source electrode 112, the wiring portion 113a, the branch portion 114a, and a top of the channel protection layer 108. The lower passivation layer 115 is formed from an inorganic material such as silicon oxide (SiO). A contact hole is provided in the lower passivation layer 115, above the source electrode 112.

A side wall of the contact hole in the lower passivation layer 115 is covered by a connection electrode 116. The connection electrode 116 has a bottom portion that is electrically connected to the source electrode 112 and a top portion that covers a part of the lower passivation layer 115. The connection electrode 116 may be formed from the same material as the source electrode 112.

An upper passivation layer 117 is formed so as to cover the connection electrode 116 and a surface of the lower passivation layer 115. An inter-layer insulation layer 118 is stacked over the upper passivation layer 117. The inter-layer insulation layer 118 is formed from an insulating material such as a polyimide resin, an acrylic resin, and the like.

A contact hole 118a is provided in the upper passivation layer 117 and the inter-layer insulation layer 118. The connection electrode 116 is exposed at the interior of contact hole 118a.

A branch portion 119a of the negative electrode power line 119 is arranged over the inter-layer insulation layer 118. The branch portion 119a extends along a vertical line of the display panel 100. One branch portion 119a is provided for every set of three sub-pixels aligned along a horizontal line.

The gate electrode 102, the gate insulation layer 105, the channel layer 106, the drain electrode 109, and the source electrode 110, within the multi-layer wiring layer 2 configured as described above, configure a thin-film transistor Tr1. Likewise, the gate electrode 103, the gate insulation layer 105, the channel layer 107, the drain electrode 111, and the source electrode 112, within the multi-layer wiring layer 2 configured as described above, configure a thin-film transistor Tr2. The thin-film transistor Tr1 serves as a select transistor, and the thin-film transistor Tr2 serves as a drive transistor.

1.1.3. Partition Wall

A partition wall 122 is formed from any of an organic material such as an acrylic resin, a polyimide resin, and a novolac-type phenol resin, and an inorganic material such as silicon oxide (SiO) and silicon nitride (SiN). The partition wall 122 defines the sub-pixels. The height of a top face of the partition wall 122, from a top face of the inter-layer insulation layer 118, is approximately 1 μm. Each region defined by the partition wall 122 is a sub-pixel region. Further, three such sub-pixel regions aligned along a horizontal line form a pixel region.

1.1.4. Organic Electroluminescence Element

The organic electroluminescence element 3 includes a pixel electrode 120, a hole injection layer 121, a hole transport layer 123, an organic light-emitting layer 124, an electron transport layer 125, and a counter electrode 126, all of which are layered over the multi-layer wiring layer 2.

The pixel electrode 120, which serves as a first electrode of the present disclosure, forms a line or a matrix over the inter-layer insulation layer 118 of the multi-layer wiring layer 2, and is electrically connected to the connection electrode 116 of the multi-layer wiring layer 2 through the contact hole 118a. The pixel electrode 120 is, for example, configured from an optically reflective material such as aluminum, silver, an alloy of silver, palladium, and copper (hereinafter, APC), and an alloy of silver, rubidium, and gold (hereinafter, ARA).

The hole injection layer 121 covers respective surfaces of the inter-layer insulation layer 118, the branch portion 119a, and the pixel electrode 120. The hole injection layer 121 is formed from a transition metal oxide. The transition metal oxide may be an oxide of a transition metal or an oxide of an alloy containing a transition metal. A transition metal is any element in groups 3 through 11 of the periodic table. Among such transition metal elements, any one of tungsten, molybdenum, nickel, titanium, vanadium, chromium, manganese, iron, cobalt, niobium, hafnium, tantalum, and so on is beneficial due to having high hole injection performance once oxidized. Specifically, tungsten, molybdenum, and nickel have greater hole injection capabilities when oxidized, in comparison to other transition metals, due to having a high in-gap state upon oxidation. As such, these elements are beneficially used as the transition metal for the hole injection layer 121 in the display panel 100.

The hole transport layer 123 and the organic light-emitting layer 124 are layered in the stated order within one sub-pixel region defined by the partition wall 122.

The hole transport layer 123 is, for example, formed from one of poly(3,4-ethylenedioxythiophene) polystyrene sulfonate (hereinafter, PEDOT:PSS) and a PEDOT:PSS derivative (e.g., a copolymer or the like), and serves to transport holes injected by the hole injection layer 121 to the organic light-emitting layer 124.

The organic light-emitting layer 124 is formed, for example, from poly(9,9-di-n-octylfluorene-alt-benzothiadiazole) (hereinafter, F8BT), which is an organic macromolecule, and serves to emit light through organic electroluminescence. The organic light-emitting layer 124 is not limited to being formed from F8BT. That is, the organic light-emitting layer 124 may be formed to include other known organic materials. For example, any one of oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, and rare earth metal complex, as disclosed in Japanese Patent Application Publication No. H5-163488, is beneficial.

The electron transport layer 125, the counter electrode 126, and a sealing layer 127 are layered in the stated order to extend continuously across the regions defined by the partition wall 122.

The electron transport layer 125 is formed, for example, from one of barium, phthalocyanine, lithium fluoride, and a mixture thereof. The electron transport layer 125 serves to transport electrons injected by the counter electrode 126 to the organic light-emitting layer 124.

The counter electrode 126, which serves as a second electrode of the present disclosure, is formed from one of indium-tin oxide (hereinafter, ITO) and indium-zinc oxide (hereinafter, IZO), for example. When the organic electroluminescence element 3 is a top emission element, the material for the counter electrode 126 is beneficially optically transmissive. When the material for the counter electrode 126 is one of silver and an alloy that includes silver, the counter electrode 126 is formed with a thickness allowing light to pass therethrough. Specifically, a thickness of no less than 20 nm and no more than 30 nm is beneficial.

1.1.5. Sealing Layer

The sealing layer 127 is formed, for example, from a material such as silicon nitride (SiN) and silicon oxynitride (SiON). The sealing layer 127 serves to constrain exposure of the organic electroluminescence element 3 and the like to water and to the atmosphere. When the organic electroluminescence element 3 is a top-emission element, the sealing layer 127 is beneficially configured from an optically transmissive material.

1.2. Frame Region Configuration

Figure 3:
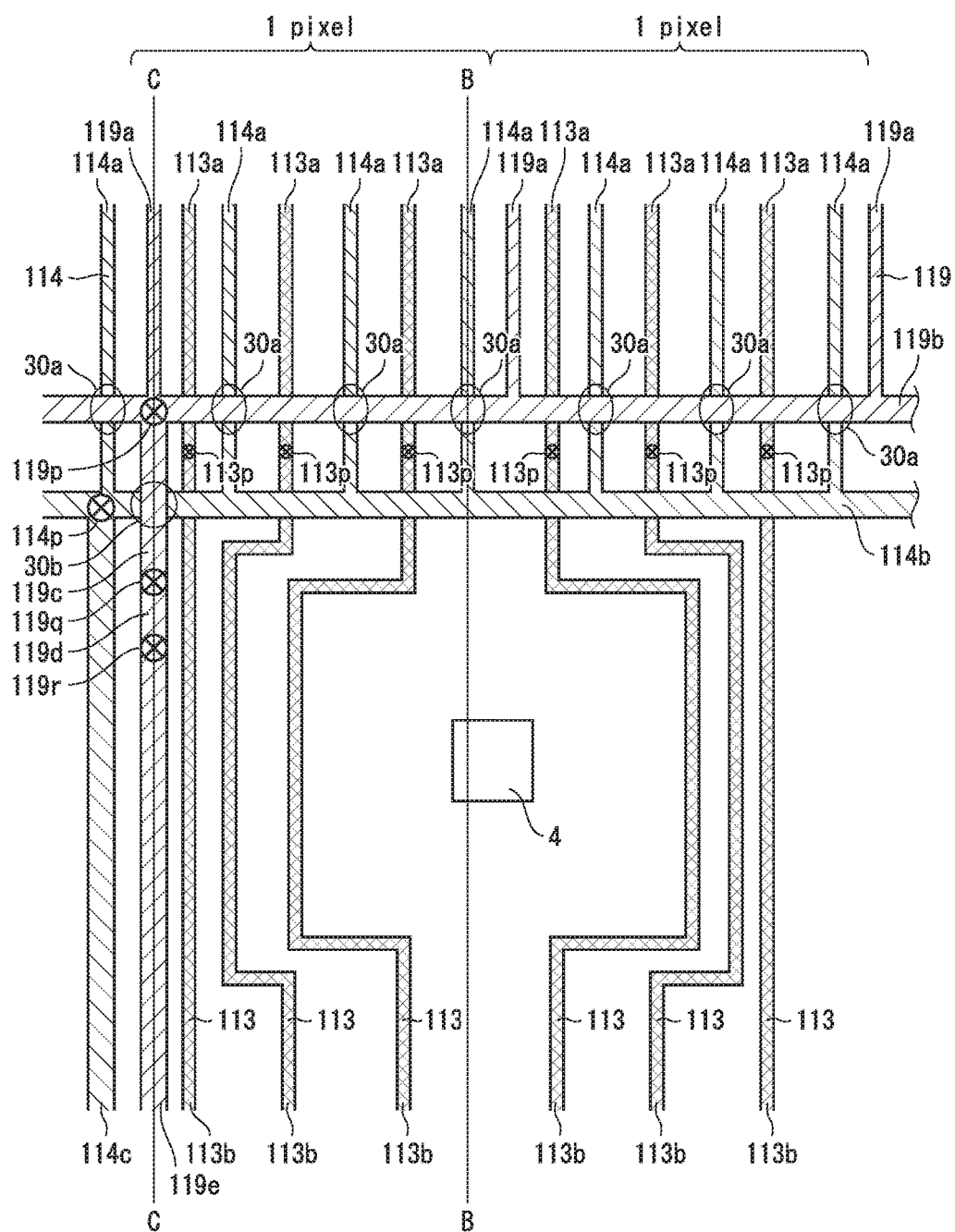
FIG. 3 is a schematic view illustrating a wiring layout in a frame region within a range indicated by chained line E in FIG. 1B.
Figure 4:
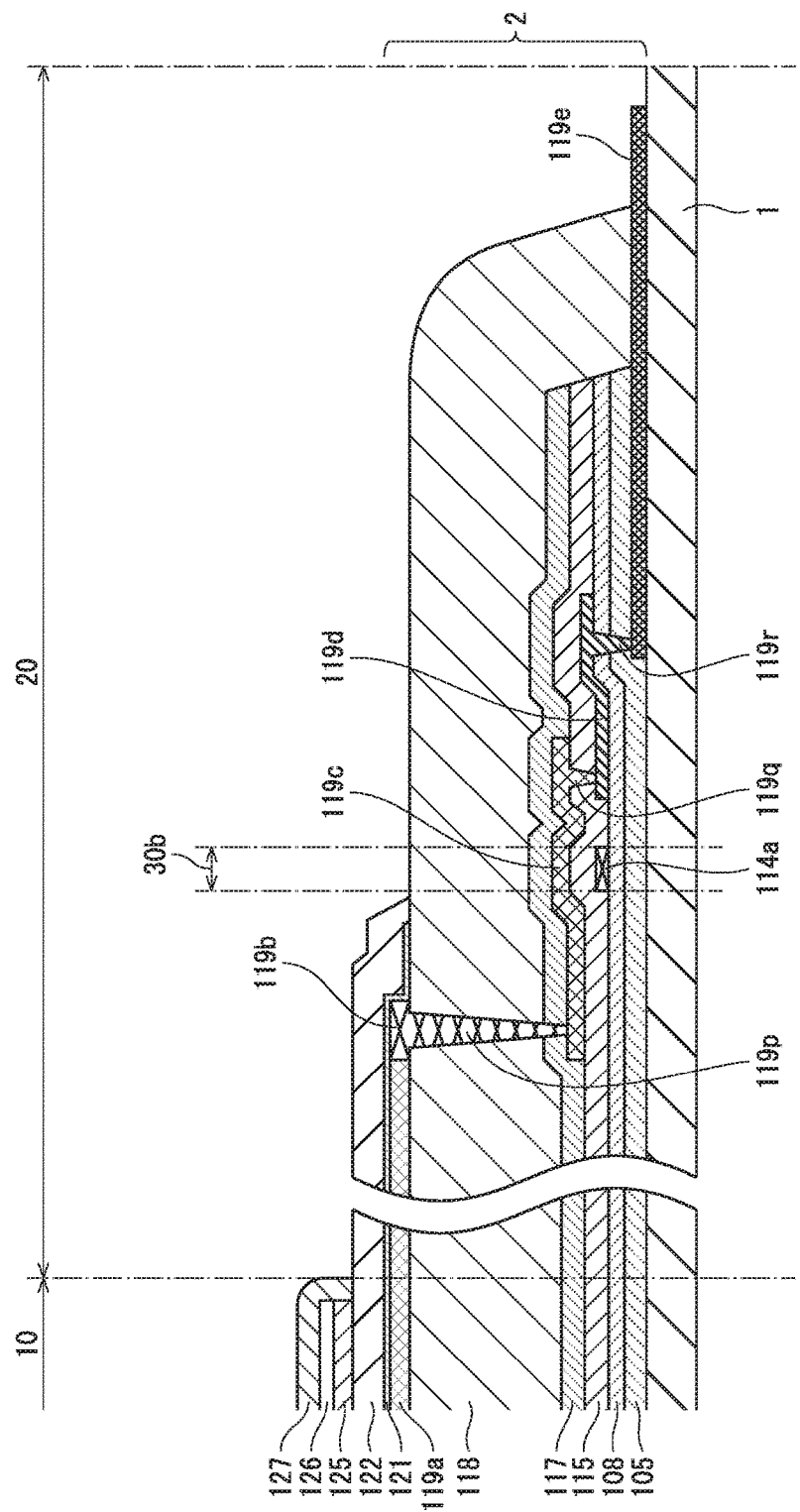
FIG. 4 is a partial cross-sectional diagram illustrating the overall configuration of the display panel in the frame region, in a cross-section taken along line C-C of FIG. 3.
Figure 5:
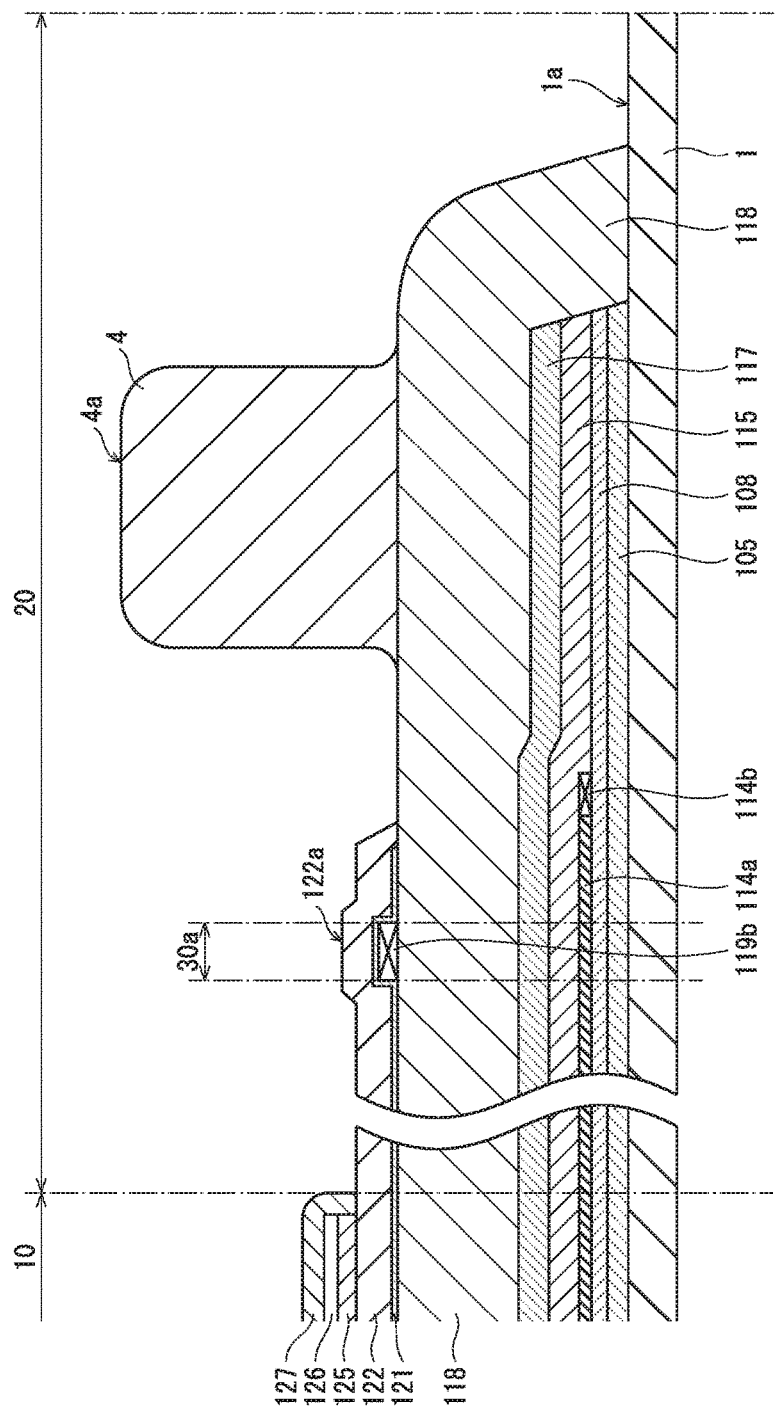
FIG. 5 is a partial cross-sectional diagram illustrating the overall configuration of the display panel in the frame region, in a cross-section taken along line B-B of FIG. 3.

FIG. 3 is a schematic diagram illustrating the wiring layout in the frame region 20. FIG. 3 illustrates the wiring in the multi-layer wiring layer 2 within the range surrounded by chained line E in FIG. 1B. In FIG. 3, the upper side of the page faces the display region 10, the longitudinal direction of the page is aligned with the short side of the frame region 20, and the lateral direction of the page is aligned with the long side of the frame region 20. FIG. 4 is a partial cross-sectional diagram illustrating the overall configuration of the display panel 100, taken along line C-C of FIG. 3. FIG. 5 is a partial cross-sectional diagram illustrating the overall configuration of the display panel 100, taken along line B-B of FIG. 3.

As illustrated in FIG. 3, the negative electrode power line 119 includes a plurality of branch portions 119a, a stem portion 119b connected thereto, and extensions 119c, 119d, and 119e extending from the stem portion 119b.

Each of the branch portions 119a extends linearly from the display region 10 to the frame region 20, being parallel to the short side of the frame region 20.

The stem portion 119b extends in parallel to the long side of the frame region 20 and is connected to all of the branch portions 119a arranged within one partition region V. Thus, the negative electrode power line 119 becomes a single line at the stem portion 119b.

The extensions 119c, 119d, and 119e extend in parallel to the short side of the frame region 20. Here, the extensions 119c, 119d, and 119e are aligned linearly, in plan view. However, as illustrated in FIG. 4, the extensions 119c, 119d, and 119e are each arranged in a different tier of the multi-layer wiring layer 2.

Specifically, the top face of the substrate 1 is considered a first tier, the top face of the channel protection layer 108 is considered a second tier, the top face of the lower passivation layer 115 is considered a third tier, and the top face of the inter-layer insulation layer 118 is considered a fourth tier. As such, the extension 119c is formed on the third tier, and is electrically connected to the stem portion 119b, which is formed on the fourth tier, through a contact hole 119p. The extension 119d is formed on the second tier, and is electrically connected to the extension 119c, which is formed on the third tier, through a contact hole 119q. The extension 119e is formed on the first tier, and is electrically connected to the extension 119d, which is formed on the second tier, through a contact hole 119r.

Returning to FIG. 3, the positive electrode power line 114 includes a plurality of the branch portions 114a, a stem portion 114b connected thereto, and an extension 114c extending from the stem portion 114b.

Each of the branch portions 114a extends linearly from the display region 10 to the frame region 20, being parallel to the short side of the frame region 20.

The stem portion 114b extends in parallel to the long side of the frame region 20 and is connected to all of the branch portions 114a arranged within one partition region V. Thus, the positive electrode power line 114 becomes a single line at the stem portion 114b.

The extension 114c extends in parallel to the short side of the frame region 20. Here, the stem portion 114b is formed on the second tier, and the extension 114c is formed on the first tier. The stem portion 114b and the extension 114c are electrically connected through a contact hole 114p.

According to this wiring layout, in plan view of the substrate 1, the positions where the branch portions 114a connect to the stem portion 114b are located farther from the display region 10, in comparison with the position where the stem portion 119b is arranged. As such, the branch portions 114a extend from the display region 10 and intersect, without direct contact, the stem portion 119b at positions 30a, before connecting to the stem portion 114b. In addition, the position where the stem portion 119b is arranged is located closer to the display region 10, in comparison with the position where the stem portion 114b is arranged. Thus, the extension 119c, which extends from the stem portion 119b toward a direction opposite the display region 10, intersects, without direct contact, the stem portion 114b at position 30b.

Further, each of the data signal lines 113 includes a wiring portion 113a, formed on the second tier, and a wiring portion 113b, formed on the first tier. The wiring portions 113a and the wiring portion 113b are connected via a contact hole 113p.

Here, the wiring portions 113b of some of the data signal lines 113 differ from the wiring portions 113b of the rest of the data signal lines 113, which extend linearly from the corresponding wiring portions 113a. Due to such different wiring portions 113b existing, the density of the wiring portions 113b changes. Specifically, among wiring portions 113b included in two wiring portion sets respectively corresponding to two pixels adjacent side-by-side, four wiring portions 113b nearest to a boundary between the two pixels each (i) extend from the corresponding wiring portion 113a along the short side of the frame region 20, (ii) make a first turn away from the boundary to extend along the long side of the frame region 20, (iii) make a second turn to extend along the short side of the frame region 20, (iv) make a third turn toward the boundary to extend toward the boundary, and (v) make a fourth turn at a position where a virtual line being an extension of the corresponding wiring portion 113a meets the wiring portion 113b to extend along the short side of the frame region 20.

As a result, at the vicinity of the boundary, a region is formed where there is no wiring, or more specifically, a region including none of the positive electrode power line 114, the negative electrode power line 119, and the data signal lines 113. Such a region is formed for each pair of two pixels adjacent side-by-side, at the vicinity of the boundary between the two pixels. Further, one mask-holding member 4 is formed over each of such regions. Here, due to the positions where the stem portion 114*b* and the stem portion 119*b* are arranged being closer to the display region 10, in comparison with the position where the mask-holding member 4 is formed, the mask-holding member 4 does not overlap with the positions 30*a*, where the stem portion 119*b* and the branch portion 114*a* intersect, or the position 30*b*, where the stem portion 114*b* and the extension 119*c* intersect.

Specifically, as illustrated in FIG. 5, the mask-holding member 4 is formed over the inter-layer insulation layer 118 on the fourth tier. Further, each of the tiers below the mask-holding member 4 (i.e., the first tier, the second tier, and the third tier) does not have any wiring (i.e., the positive electrode power line 114, the negative electrode power line 119, or the data signal lines 113) provided thereon. Also, in plan view of the substrate 1, the mask-holding member 4 has a square shape with sides of approximately 10 µm. Further, a top portion 4*a* of the mask-holding member 4 is located at a height of approximately 10 µm from the top face of the inter-layer insulation layer 118, and a height of the top portion 4*a* from a top face 1*a* of the substrate 1 is greater than a height of a top portion 122*a* of the partition wall 122 from the top face 1*a* of the substrate 1.

Further, when the display panel 100 has a wide display region 10 and a narrow frame region 20, the mask used in manufacturing the display panel 100 may not cover the positions 30*a* and the position 30*b*. Even when using such mask, the mask needs to cover the positive electrode power line 114 and the negative electrode power line 119 at the edge of the display panel 100, so that the positive electrode power line 114 and the negative electrode power line 119 can be connected with the drive circuit. However, in the display panel 100, the mask-holding member 4 is formed between the positions 30*a* and position 30*b* and the edge of the display panel 100. As such, using a mask covering the area from the mask-holding member 4 to the edge of the display panel 100 results in the mask covering the portions of the positive electrode power line 114 and the negative electrode power line 119 to be exposed, while the mask-holding member 4 avoids unintentional localized mis-pressing.

2. Manufacturing Method for Display Panel

A manufacturing method for the display panel 100 pertaining to the present Embodiment is characterized for the forming of the organic electroluminescence elements 3, which is performed after the formation of the multi-layer wiring layer 2, being interrupted once for the forming of the mask-holding members 4 and being resumed after the forming of the mask-holding members 4. As such, the following explanation describes the manufacturing of the display panel 100 from a point following the formation of the multi-layer wiring layer 2 until the formation of the mask-holding members 4. FIGS. 6A through 6E are schematic diagrams illustrating the manufacturing of the display panel 100, from a point after the formation of the multi-layer wiring layer 2 until the formation of the mask-holding members 4. In FIGS. 6A through 6E, the left-hand side illustrates a cross-section of the display region 10 along a horizontal line, and the right-hand side illustrates a cross-section of the frame region 20 along a vertical line.

Figure 6A:
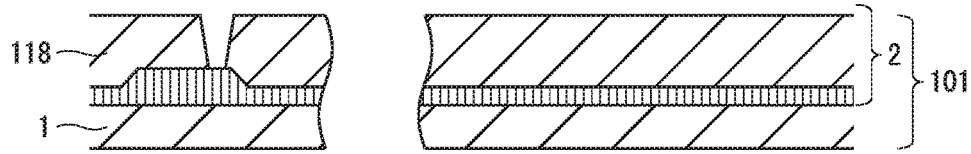
FIGS. 6A through 6E are schematic diagrams illustrating a manufacturing method of the display panel, from a point after the completion of a multi-layer wiring layer to the formation of a mask-holding member.

As illustrated in FIG. 6A, first, a multi-layer wiring substrate 101 is prepared. The multi-layer wiring substrate 101 is an intermediate product at a point prior to the formation of the branch portion 119*a* and the stem portion 119*b* of the negative electrode power line 119 over the inter-layer insulation layer 118.

Figure 6B:
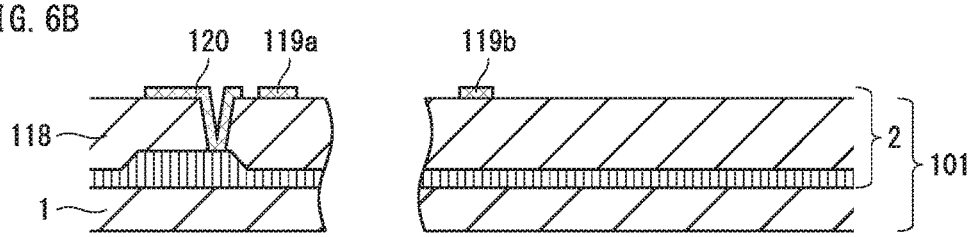

Next, as illustrated in FIG. 6B, the pixel electrode 120 and the branch portion 119*a* of the negative electrode power line 119 are formed over the inter-layer insulation layer 118 within the display region 10, and the stem portion 119*b* of the negative electrode power line 119 is formed within the frame region 20. The pixel electrode 120, the branch portion 119*a*, and the stem portion 119*b* may be formed in one same process. An example of such a process is described. First, a film of metallic material is formed uniformly over the inter-layer insulation layer 118 by sputtering the metallic material. Then, a resist layer is uniformly formed over the metallic material film so deposited. Further, a mask having apertures of a predetermined shape is superposed over the resist layer, and the mask is then exposed to light from above. Subsequently, any excess resist is washed away with a developing fluid (e.g., a tetra methyl ammonium hydroxide (hereinafter, TMAH) solution). Afterward, wet etching of the metallic material film is performed with a wet etching fluid, with respect to both the display region 10 and the frame region 20 at once. Finally, the resist layer is removed with an organic peeling fluid, for example. This completes the patterning to form the shape of the pixel electrode 120, the branch portion 119*a*, and the stem portion 119*b*.

After the formation of the pixel electrode 120, a metallic material having lower resistivity than the material of the pixel electrode 120 is used to form the branch portion 119*a* and the stem portion 119*b*, using a similar process as the forming of the pixel electrode 120. Here, although not illustrated in FIG. 6B, the stem portion 119*b* is electrically connected to the extension 119*c* through the contact hole 119*p* in the multi-layer wiring layer 2.

Figure 6C:
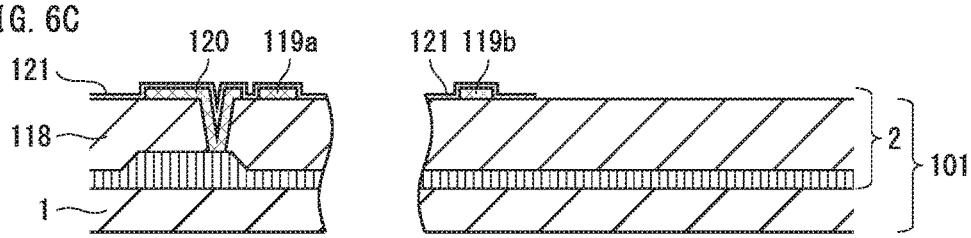

Next, as illustrated in FIG. 6C, the hole injection layer 121 is formed uniformly over the interlayer insulation layer 118, the branch portion 119*a*, and the pixel electrode 120, within the display region 10. Meanwhile, within the frame region 20, the hole injection layer 121 is deposited as far as where the stem portion 119*b* has been formed. The hole injection layer 121 may be formed by using a reactive sputtering method, for example.

Figure 6D:
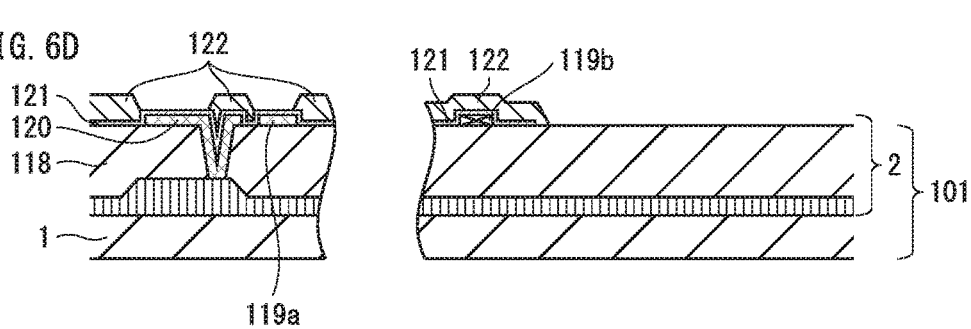

Furthermore, as illustrated in FIG. 6D, the partition wall 122 is formed over the hole injection layer 121.

Figure 6E:
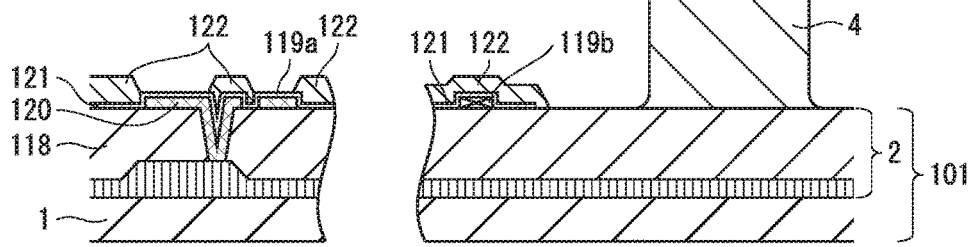

After the formation of the partition wall 122, the mask-holding member 4 is formed in the frame region 20, as illustrated in FIG. 6E. The mask-holding member 4 may be formed using a die coating method, for example. When forming the mask-holding member 4 using the die coating method, the top portion 4*a* of the mask-holding member 4 is beneficially located at a height of approximately 10 from the top face of the inter-layer insulation layer 118. For example, the mask-holding member 4 having the height of approximately 10 µm may be formed by applying a high-viscosity ink. As another example, the mask-holding member 4 having the height of approximately 10 µm may also be formed by applying an ink material including a spacer having a diameter on the order of 10 µm. As yet another example, the mask-holding member 4 having the height of approximately 10 µm may also be formed by applying a high-viscosity ink from a nozzle having a diameter on the order of 10 µm.

In the manufacturing method for the display panel 100 pertaining to the present Embodiment, the mask-holding members 4 are formed through such a process.

Here, when forming the pixel electrode 120 using the same metallic material as the branch portion 119*a* of the negative electrode power line 119, the branch portion 119*a* and the pixel electrode 120 may be formed in one same process during the manufacturing of the multi-layer wiring layer 2. Such a process involves, for example, uniformly forming a film of metallic material over the inter-layer insulation layer 118 by sputtering the metallic material, uniformly forming a resist layer over the metallic material film, and performing wet etching of the metallic material film with respect to both the display region 10 and the frame region 20 at once. This completes the patterning to form the shapes of the branch portion 119a and the pixel electrode 120.

2.1. Deposition Following Mask-Holding Member Formation

Once the mask-holding members 4 have been formed, the formation of the organic electroluminescence elements 3 is resumed in the manufacturing method of the display panel 100 pertaining to the present Embodiment.

The forming of the organic electroluminescence elements 3, which is performed after the forming of the mask-holding members 4, includes the deposition of certain layers using a mask having a frame portion that covers the frame region 20. Layers of the organic electroluminescence element 3 that are formed through deposition using such a mask include the electron transport layer 125, the counter electrode 126, and the sealing layer 127, for example. Typically, the electron transport layer 125 is formed using a vapor deposition method, the counter electrode 126 is formed using one of a sputtering method and a vapor deposition method, and the sealing layer 127 is formed using one of a CVD method and an ALD method.

The mask-holding members 4 come in contact with the mask and receive the pressure from the mask in the deposition of such layers. The following explains how the mask-holding members 4 function during the deposition of such layers, with reference to the deposition of the electron transport layer 125, which is taken as one example of layer deposition conducted following the formation of the mask-holding members 4.

FIG. 7 is a schematic diagram illustrating the deposition of the electron transport layer 125. FIG. 7 illustrates a state where a mask 200 is in contact with a display panel intermediate product, at a point prior to the forming of the electron transport layer 125 during the manufacturing of the display panel 100. The mask 200 is typically a metallic plate of invar or the like that has been subjected to patterning through etching, lasering, and so on, or a resist pattern having a metal deposited thereon using soldering.

In FIG. 7, the mask 200 covers the frame region 20. The mask 200 is arranged parallel to the substrate 1, so as to come into contact with the top portion 4a of the mask-holding member 4. Here, even if a foreign object 300 is present, the mask 200 does not come in contact with the foreign object 300 and thus, mis-pressing of the multi-layer wiring layer 2 by the mask 200 via the foreign object 300 does not occur, as long as a height of a top portion 300a of the foreign object 300 from the top face 1a of the substrate 1 is smaller than the height of the top portion 4a of the mask-holding member 4 from the top face 1a of the substrate 1.

Specifically, as illustrated in FIG. 7, the risk of short-circuiting between the negative electrode power line 119 and the positive electrode power line 114 occurring due to mis-pressing of the multi-layer wiring layer 2 is reduced even when the foreign object 300 is adhering to one of the positions 30a, where the stem portions 119b and the branch portion 114a intersect without direct contact.

Meanwhile, in deposition using the vapor deposition method, the sputtering method, the CVD method, or the like, a gap existing between the mask and the display panel intermediate product, on which a layer is formed through the deposition, poses a risk of vaporized vapor deposition material or sputtering particles entering through apertures of the mask to be deposited below the mask. In the example illustrated in FIG. 7, the mask 200 is in contact with the top portion 4a of the mask-holding member 4. Thus, there is a gap between the mask 200 and the partition wall 122, above the frame region 20.

However, this gap has a height equal to the difference in height between the top portion 4a and the top portion 122a, which is approximately 9 µm in the present Embodiment. With a gap of this size, the amount of vaporized vapor deposition material slipping beneath the mask 200 is sufficiently small, and thus, the electron transport layer 125 is not formed in the frame region 20 covered by the mask 200.

That is, it is beneficial that the mask-holding members 4 be provided with a height that substantially prevents vaporized vapor deposition material, sputtering particles, or the like from entering the gap produced under the mask 200 when the mask 200 comes into contact with the top portions 4 during deposition using the vapor deposition method, the sputtering method, the CVD method, or the like.

Performing deposition as described above enables manufacturing the display panel 100 pertaining to the present Embodiment while avoiding contact between the mask 200 and any foreign object 300 unintentionally adhering to the frame region 20.

Although FIG. 7 illustrates deposition being performed with the deposition target surface oriented upward, actual vapor deposition involves the mask 200 being fixed to the display panel intermediate product with the deposition target surface oriented downward. Fixing the mask 200 with the deposition target surface oriented downward involves, for example, configuring the mask 200 with an iron alloy, arranging the mask 200 below the display panel intermediate product with the deposition target surface oriented downward, and using a magnet to attract having the mask 200 to the display panel intermediate product from an underside of the substrate 1.

Meanwhile, deposition using the sputtering method can be performed while loading the mask 200 onto the display panel intermediate product with the deposition target face oriented upward.

3. Effects

The display panel 100 pertaining to the above-described disclosure has the mask-holding members 4 provided over the multi-layer wiring layer 2 in the frame region 20. As such, although some foreign object may unintentionally adhere to the multi-layer wiring layer 2 during the manufacturing of the display panel 100, the mask 200 arranged parallel to the substrate 1 comes into contact with the mask-holding members 4, provided that the height of the top portion 300a of the foreign object 300 from the top face 1a of the substrate 1 is smaller than the height of the top portions 4a of the mask-holding members 4 from the top face 1a of the substrate 1. This prevents the multi-layer wiring layer 2 from being damaged at an unintended position due to the mask 200 coming into contact with the foreign object 300.

Furthermore, each mask-holding member 4 is provided at a position not overlapping at least one of the positive electrode power line 114 and the negative electrode power line 119, in plan view of the display panel 100. That is, the mask-holding member 4 does not overlap any of the positions 30a, where the positive electrode power line 114 and the negative electrode power line 119 intersect without direct contact. As such, although the multi-layer wiring layer 2 may be pressed-down at the position where the mask-holding member 4 is provided when the mask 200 comes into contact with the mask-holding member 4, problems such as short-circuiting between the positive electrode power line 114 and the negative electrode power line 119, a decrease in distance between the positive electrode power line 114 and the negative electrode power line 119, a reduction in withstand voltage, and an increase in leak current are nevertheless be avoided.

Further still, in the display panel 100 pertaining to the present disclosure, each mask-holding member 4 is provided at a position not overlapping the positive electrode power line 114 and the negative electrode power line 119, in plan view of the substrate 1. Accordingly, although the multi-layer wiring layer 2 may be pressed-down at the position where the mask-holding member 4 is provided when the mask 200 comes into contact with the mask-holding member 4, no mis-pressing occurs at positions overlapping the positive electrode power line 114 and the negative electrode power line 119. This enables changes in resistivity and interruption due to mis-pressing to be avoided for the positive electrode power line 114 and the negative electrode power line 119.

In addition, in the display panel 100 pertaining to the present disclosure, each mask-holding member 4 is provided at a position not overlapping the scan signal line 104 and the data signal lines 113, in plan view of the substrate 1. Accordingly, although the multi-layer wiring layer 2 may be pressed-down at the position where the mask-holding member 4 is provided when the mask 200 comes into contact with the mask-holding member 4, no mis-pressing occurs at positions overlapping the scan signal line 104 and the data signal lines 113. This enables changes in resistivity and interruption due to mis-pressing to be avoided for the scan signal line 104 and the data signal lines 113.

Additionally, the plurality of mask-holding members 4 in the frame region 20 are separated from one another. The mask-holding members 4, being separated from one another, are arranged with mutual separation, and have the data signal lines 113, the positive electrode power line 114, and the negative electrode power line 119 arranged therebetween, in plan view. As such, the positions where the mask-holding members 4 are provided do not overlap where the data signal lines 113, the positive electrode power line 114, and the negative electrode power line 119 are arranged, in plan view.

Note that when only one mask-holding member is disposed, the mask 200 may tilt upon coming into contact with the top portion of this mask-holding member. When this tilt occurs, the mask 200 may come into contact with the foreign object 300 even if the height of the top portion 300a of the foreign object 300 is smaller than the height of the top portion of the mask-holding member. However, since the mask-holding members 4 are provided in plurality and are separated from one another in the present embodiment, the situation is prevented where the mask 200 tilts and comes in contact with the foreign object 300 existing between the mask-holding members 4. Further, the display panel 100 pertaining to the present disclosure has a rectangular frame, and the mask-holding members 4 are provided along both the short edges and the long edges of the display panel 100. That is, three or more mask-holding members 4 not arranged on a single straight line are provided, which enables the mask 200 to be stable when put in contact with the mask-holding members 4.

Further, in the frame region, the positive electrode power line 114 includes the branch portions 114a that, in plan view of the substrate 1, extend linearly from the display region 10. Further, in the frame region, the negative electrode power line 119 includes the branch portions 119a that, in plan view of the substrate 1, extend linearly from the display region 10 in parallel to the branch portions 114a, and the stem portion 119b that is connected to the branch portions 119a and that, in plan view of the substrate 1, extends in a direction orthogonal to the branch portions 119a. In addition, in the frame region 20, the branch portions 114a and the stem portion 119b are disposed on different layers of the multi-layer wiring layer 2 and intersect without direct contact.

In addition, in the frame region 20, the positive electrode power line 114 includes the stem portion 114b that is connected to the branch portions 114a and that, in plan view of the substrate 1, extends in a direction orthogonal to the branch portions 114a. Further, in the frame region 20, the negative electrode power line 119 includes the extensions 119c that are connected to the stem portion 119b and that, in plan view of the substrate 1, extend in parallel to the branch portions 119a. In addition, in the frame region 20, the stem portion 114b and the extensions 119 care disposed on different layers of the multi-layer wiring layer 2 and intersect without direct contact.

In the frame region 20, the positive electrode power line 114 and the negative electrode power line 119 intersect one another as described above. However, the mask-holding members 4 are disposed not to overlap with such intersections of the positive electrode power line 114 and the negative electrode power line 119. Thus, the possibility of mis-pressing occurring, during the manufacturing process, at a position where the positive electrode power line 114 and the negative electrode power line 119 intersect is reduced.

Embodiment 2

In Embodiment 1, the manufacturing of the display panel 100 is performed such that a separate process of forming the mask-holding members 4 is inserted in the process of forming the organic electroluminescence elements 3. Meanwhile, Embodiment 2 describes a display panel 100a, whose manufacturing is performed such that the forming of mask-holding members 4A is included as a part of the process of forming the organic electroluminescence elements 3.

1. Display Panel Configuration

Figure 8:
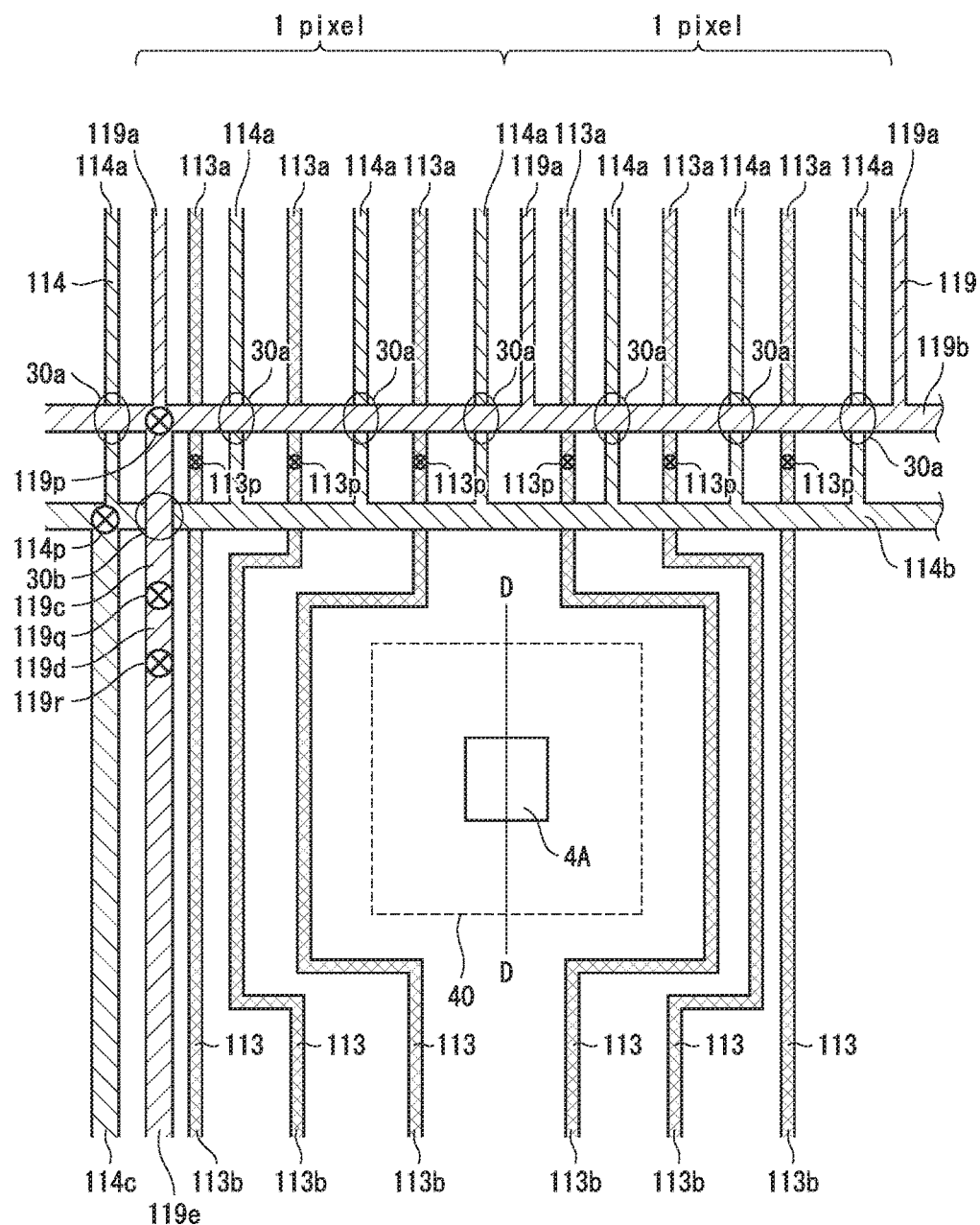
FIG. 8 is a schematic diagram illustrating the positional relationship between a wiring layout and the mask-holding member in the frame region of the display panel pertaining to Embodiment 2.

FIG. 8 is a schematic diagram illustrating the positional relationship between a wiring layout and the mask-holding members 4A in the frame region 20 of the display panel 100a pertaining to Embodiment 2. FIG. 8 is similar to FIG. 3 for illustrating the wiring within the range surrounded by chained line E in FIG. 1B, which corresponds to two pixels.

Similarly to the display panel 100 pertaining to Embodiment 1, the display panel 100a pertaining to Embodiment 2 includes the data signal lines 113 arranged avoiding the positions at which the mask-holding members 4 are formed. The display panel 100a pertaining to Embodiment 2 differs from the display panel 100 pertaining to Embodiment 1 in that a mound portion 40 is provided in the multi-layer wiring layer 2 at an area where no wiring exists due to some of the data signal lines 113 of the two pixels, in plan view, making a detour around the area.

For example, when the display panel 100a is a 20-inch panel having 4K resolution, each pixel is on the order of 115 μm. As such, arranging some of the data signal lines 113 of the two pixels to make a detour in such a manner provides the mound portion 40 with a size of approximately 100 μm square, in plan view.

FIG. 9 is a partial cross-sectional diagram illustrating the schematic configuration of the frame region 20 of the display panel 100a pertaining to Embodiment 2. FIG. 9 depicts a cross-section along line D-D of FIG. 8, including one mound portion 40 and one mask-holding member 4A formed thereabove.

In the frame region 20 of the display panel 100a, the gate insulation layer 105, the channel protection layer 108, the lower passivation layer 115, the upper passivation layer 117, and the inter-layer insulation layer 118 are formed uniformly. This is similar to the display panel 100 pertaining to Embodiment 1. However, the display panel 100a pertaining to Embodiment 2 differs from the display panel 100 pertaining to Embodiment 1 in the following aspects.

In the display panel 100a, a gate electrode material layer 131 is formed over the substrate 1, from the same material as the gate electrode 102 and the gate electrode 103.

A channel material layer 132 is formed over the gate insulation layer 105, from the same material as the channel layer 106 and the channel layer 107

A source-drain electrode material layer 133 is formed over the channel protection layer 108, from the same material as the drain electrode 109, the drain electrode 111, the source electrode 110, and the source electrode 112.

A connection electrode material layer 134 is formed over the lower passivation layer 115, from the same material as the connection electrode 116.

In plan view of the substrate 1, the gate electrode material layer 131, the channel material layer 132, the source-drain electrode material layer 133, and the connection electrode material layer 134 are formed so as to overlap at a single position and each have a size of approximately 100 μm square. In the position where these material layers overlap, the display panel 100a also includes the gate insulation layer 105, the channel protection layer 108, the lower passivation layer 115, and the upper passivation layer 117. The combination of these layers stacked one on top of another at the single position forms the mound portion 40. Further, the mound portion 40 has a flat top portion 40a.

The multi-layer wiring layer 2 includes a greater number of layers at the mound portion 40 than at other areas. As such, the height of the top portion 40a of the mound portion 40, from the top face 1a of the substrate 1, is greater than the height of top portions of other areas of the multi-layer wiring layer 2, from the top face 1a of the substrate 1.

Further, in the display panel 100a, the inter-layer insulation layer 118 is formed uniformly over the upper passivation layer 117.

The inter-layer insulation layer 118 is formed from an insulating material such as a polyimide resin, an acrylic resin, and the like. The inter-layer insulation layer 118 typically serves to cover any indentations at the top face of the upper passivation layer 117, due to being formed by the insulating material applied with uniform thickness flowing to form a flat top surface. As such, the planarization effect of the inter-layer insulation layer 118 is effective over a limited area, such as an area in the display region corresponding to one individual thin-film transistor. Meanwhile, the mound portion 40 is a protrusion covering a relatively great area of approximately 100 μm square. Further, the flow of the insulating material before hardening is limited to 50 μm at most. Accordingly, above where the mound portion 40 exists, the insulating material for the inter-layer insulation layer 118 hardens before forming a flat top surface. Due to this, the planarization effect of the inter-layer insulation layer 118 is incomplete above the mound portion 40, and the portion of the inter-layer insulation layer 118 above the mound portion 40 protrudes in conformity to the protrusion of the mound portion 40.

Here, the size of the mound portion 40 required to cause the inter-layer insulation layer 118 to harden to protrude as described above without becoming completely planar is dependent upon the viscosity of the insulating material for the inter-layer insulation layer 118. That is, the size of the mound portion 40 is adjustable in accordance with properties of the insulating material for the inter-layer insulation layer 118.

Further, in the display panel 100a, a power line wiring material layer 135 is formed over the inter-layer insulation layer 118, above the mound portion 40. The power line wiring material layer 135 is formed from the same material as the branch portions 119a of the negative electrode power line 119.

Over the power line wiring material layer 135, the hole injection layer 121 is formed to have the same shape as the power line wiring material layer 135 in plan view.

The partition wall 122 is formed uniformly over the inter-layer insulation layer 118 and the hole injection layer 121.

The combination of the power line wiring material layer 135, the hole injection layer 121, and the portion of the partition wall 122 over the hole injection layer 121, layered one on top of another, forms the mask-holding member 4A pertaining to Embodiment 2.

The mask-holding member 4A in the display panel 100a, configured as described above, has a thickness greater than a thickness of a surrounding of the mask-holding member 4A by an amount corresponding to the thickness of the power line wiring material layer 135 and the thickness of the hole injection layer 121. Further, the mask-holding member 4A is formed where the mound portion 40 is formed in the multi-layer wiring layer 2. Due to this, the height of the top portion 4a of the mask-holding member 4A, from the top face 1a of the substrate 1, is greater than the height of the top face 122a of the partition wall 122 where the mound portion 40 does not exist, from the top face 1a of the substrate 1, by an amount corresponding to more than the thickness of the power line wiring material layer 135.

Specifically, it is beneficial that the height of the top portion 4a of the mask-holding member 4A, from the top face 1a of the substrate 1, be greater than the height of the top face 122a of the partition wall 122 where the mound portion does not exist, from the top face 1a of the substrate 1, by approximately 10 μm.

2. Manufacturing Method for Display Panel

A manufacturing method for the display panel 100a pertaining to Embodiment 2 is characterized for the processes conducted until the mask-holding members 4A are formed. As such, the following explanation describes the manufacturing of the display panel 100a until the formation of the mask-holding members 4A. FIGS. 10A through 10G are schematic diagrams illustrating the manufacturing of the display panel 100a, until the formation of the lower passivation layer 115. FIGS. 11A through 11E are schematic diagrams illustrating subsequent processes until the formation of the mask-holding members 4A. In FIGS. 10A through 10G and FIGS. 11A through 11E, the left-hand side illustrates a cross-section of one sub-pixel in the display region 10, and the right-hand side illustrates a cross-section of the frame region 20. In FIGS. 10A through 10G and FIGS. 11A though 11E, the cross-section of the frame region 20 is illustrated at a reduced scale of approximately one-third width.

Figure 10A:
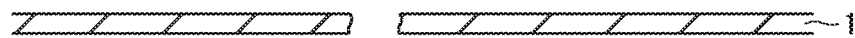
FIGS. 10A through 10G are schematic diagrams illustrating a manufacturing method of the display panel pertaining to the Embodiment 2, until the formation of a lower passivation layer.

As illustrated in FIG. 10A, the substrate 1 is first prepared in the manufacturing of the display panel 100a.

Figure 10B:

Next, as illustrated in FIG. 10B, the gate electrode 102 and the gate electrode 103 are formed over the substrate 1 in the display region 10 by patterning, and the gate electrode material layer 131 is formed over the substrate 1 in the frame region 20 by patterning. The gate electrode 102, the gate electrode 103, and the gate electrode material layer 131 are formed in one same process. Specifically, such a process may involve, for example, uniformly forming a film of metallic material over the substrate 1 by sputtering the metallic material, forming a resist layer uniformly over the metallic material film, and performing wet etching of the metallic material film with respect to both the display region 10 and the frame region 20 at once. This completes the patterning to form the shapes of the gate electrode 102, the gate electrode 103, and the gate electrode material layer 131.

Figure 10C:
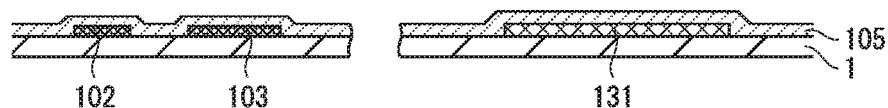

Then, as illustrated in FIG. 10C, the gate insulation layer 105 is formed uniformly, in both the display region 10 and the frame region 20. The CVD method may be used for forming the gate insulation layer 105, for example.

Figure 10D:
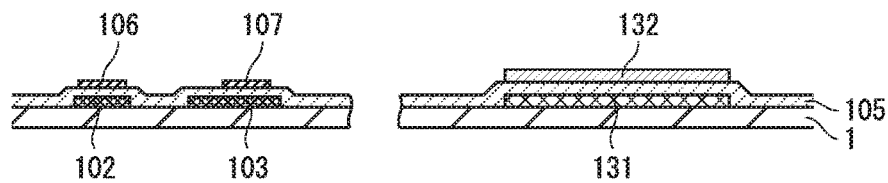

Afterward, in the display region 10, the channel layer 106 is formed over a surface portion of the gate insulation layer 105 above the gate electrode 102 by patterning, and the channel layer 107 is formed over a surface portion of the gate insulation layer 105 above gate electrode 103 by patterning, as illustrated in FIG. 10D. In the frame region 20, the channel material layer 132 is formed over a surface portion of the gate insulation layer 105 above the gate electrode material layer 131 by patterning. The channel layer 106, the channel layer 107, and the channel material layer 132 are formed in one same process. Specifically, such a process involves uniformly forming a film of semiconductor material over the gate insulation layer 105 by using the CVD method, forming a resist layer uniformly over the semiconductor material film, and performing wet etching of the semiconductor material film with respect to both the display region 10 and the frame region 20 at once. This completes the patterning to form the shapes of the channel layer 106, the channel layer 107, and the channel material layer 132.

Figure 10E:
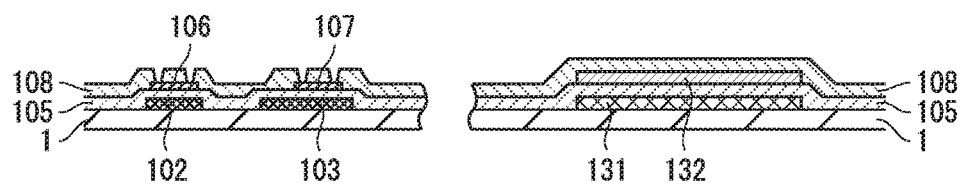

Next, as illustrated in FIG. 10E, the channel protection layer 108 is formed in both the display region 10 and the frame region 20. The forming of the channel protection layer 108 includes the following processes performed in the stated order: (i) forming a film of insulating material uniformly over the gate insulation layer 105, the channel layer 106, the channel layer 107, and the channel material layer 132; (ii) forming, for each of the channel layer 106 and the channel layer 107, a contact hole exposing a part of the channel layer by removing a portion of the insulating material film with a photolithography method; and (iii) completing the forming of the channel protection layer 108 by heating the insulating material film with parts of the channel layer 106 and the channel layer 107 exposed.

Figure 10F:
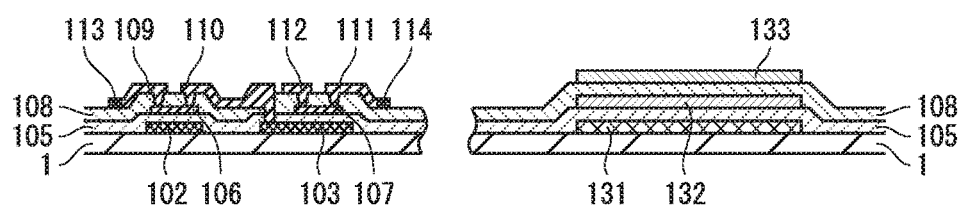

Subsequently, in the display region 10, wiring is formed on the channel protection layer 108 by patterning, and in the frame region 20, the source-drain electrode material layer 133 is formed on the channel protection layer 108 above the channel material layer 132, as illustrated in FIG. 10F. The wiring formed on the channel protection layer 108 in the display region 10 includes: the drain electrode 109; the drain electrode 111; the source electrode 110; the source electrode 112; the wiring portion 113a; and the branch portion 114a. The wiring on the channel protection layer 108 in the display region 10 and the source-drain electrode material layer 133 may be formed in one same process. Such a process involves, for example, uniformly forming a film of metallic material on the channel protection layer 108 by sputtering the metallic material, forming a resist layer uniformly over the metallic material layer, and performing wet etching of the metallic material film with respect to both the display region 10 and the frame region 20 at once. This completes the patterning to form the shapes of the wiring on the channel protection layer 108 and the source-drain electrode material layer 133.

Figure 10G:
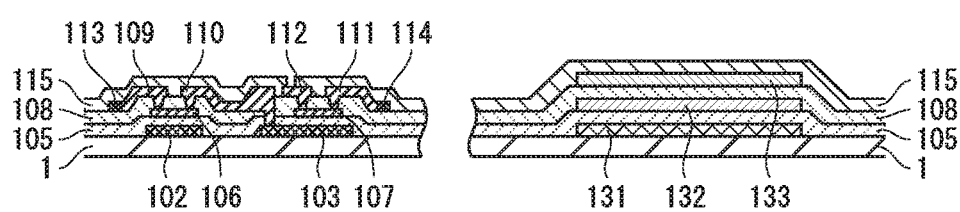

Next, as illustrated in FIG. 10G the lower passivation layer 115 is formed in both the display region 10 and the frame region 20. The forming of the lower passivation layer 115 includes the following processes performed in the stated order: (i) forming a film of insulating material uniformly over the channel protection layer 108, the wiring on the channel protection layer 108 in the display region 10, and the source-drain electrode material layer 133; (ii) forming a contact hole exposing a part of the source electrode 112 by removing a portion of the insulating material film with a photolithography method; and (iii) completing the forming of the lower passivation layer 115 by heating the insulating material film with a part of the source electrode 112 exposed.

Then, a film of metallic material is formed uniformly over the substrate 1 in both the display region 10 and the frame region 20 by sputtering the metallic material, with the contact hole formed in the lower passivation layer 115, a resist layer is uniformly over the metallic material film, and wet etching of the metallic material film is performed with respect to both the display region 10 and the frame region 20 at once. This completes the patterning to form the shape of the connection electrode 116 in the display region 10 and the shape of the connection electrode material layer 134 in the frame region 20. As a result, in the display region 10, the connection electrode 116 is formed over the lower passivation layer 115 and is electrically connected to the source electrode 112 through the contact hole formed in the lower passivation layer 115, and in the frame region 20, the connection electrode material layer 134 is formed over the lower passivation layer 115, and as illustrated in FIG. 11A, Afterward, as illustrated in FIG. 11B, the upper passivation layer 117 is formed in both the display region 10 and the frame region 20. Subsequently, as illustrated in FIG. 11C, the inter-layer insulation layer 118 is formed over the upper passivation layer 117.

The forming of the upper passivation layer 117 includes the following processes performed in the stated order: (i) forming a film of insulating material uniformly over the lower passivation layer 115, the connection electrode 116, and the connection electrode material layer 134; and (ii) forming a contact hole exposing a part of the connection electrode 116 by removing a portion of the insulating material film with a photolithography method.

The forming of the inter-layer insulation layer 118 includes the following processes performed in the stated order: (i) applying a polyimide resin over the upper passivation layer 117 so that the polyimide resin forms a film having uniform thickness; (ii) forming the contact hole 118a by removing a part of the polyimide resin film corresponding to the contact hole formed in the upper passivation layer 117; and (iii) completing the forming of the inter-layer insulation layer 118 by curing the polyimide resin film.

The processes up to this point produce the mound portion 40 in the frame region 20, which includes the gate electrode material layer 131, the gate insulation layer 105, the channel material layer 132, the channel protection layer 108, the source-drain electrode material layer 133, the lower passivation layer 115, the connection electrode material layer 134, and the upper passivation layer 117 layered one on top of another.

Here, note that in the display region 10, the top face of the upper passivation layer 117 typically has indentations over the thin-film transistor. However, the area corresponding to one thin-film transistor for one sub-pixel, which is the range of the display region 10 illustrated in FIG. 11C, is relatively small with a width of approximately 30 μm. Thus, the inter-layer insulation layer 118 effectively covers the indentations at the top face of the upper passivation layer 117, and has a top surface with uniform height.

Conversely, in the frame region 20, a portion of the top face of the upper passivation layer 117 above the mound portion 40 is flat. However, the height of a portion of the top face of the passivation layer 117 above the mound portion 40 differs from the height of portions of the top face of the passivation layer 117 not above the mound portion 40 Further, the mound portion 40 has a width on the order of 100 μm, and is relatively wider than the width of the area in the display region 10 corresponding to one thin-film transistor. As such, in the frame region 20, the inter-layer insulation layer 118 does not completely cancel out the difference between the height of the portion of the top face of the passivation layer 117 above the mound portion 40 and the height of the portions of the top face of the passivation layer 117 not above the mound portion 40, and the height of a portion of the inter-layer insulation layer 118 above the mound portion 40 differs from the height of portions of the interlayer insulating layer 118 not above the mound portion 40.

Next, in the display region 10, the pixel electrode 120 and the branch portion 119a of the negative electrode power line 119 are formed over the inter-layer insulation layer 118 by patterning, and in the frame region 20, the power line wiring material layer 135 is formed over the inter-layer insulation layer 118 above the mound portion 40 by patterning, as illustrated in FIG. 11D. The pixel electrode 120 the branch portion 119a and the display region 10, and the power line wiring material layer 135 in the frame region 20 may be formed in one same process. Such a process involves, for example, uniformly forming a film of metallic material on the inter-layer insulation layer 118 by sputtering the metallic material, forming a resist layer uniformly over the metallic material layer, and performing wet etching of the metallic material film with respect to both the display region 10 and the frame region 20 at once. This completes the patterning to form the shapes of the pixel electrode 120, the branch portion 119a, and the power line wiring material layer 135.

Afterward, a film of the material for the hole injection layer 121 is formed uniformly in both the display region 10 and the frame region 20. Furthermore, in the frame region 20, patterning is performed to provide the hole injection layer 121 with the same shape as the power line wiring material layer 135, in plan view. Subsequently, the partition wall 122 is formed in both the display region 10 and the frame region 20.

The processes up to this point produce the mask-holding member 4A as illustrated in FIG. 11E. The mask-holding member 4A is formed in the frame region 20 above the mound portion 40, and includes the power line wiring material layer 135, the hole injection layer 121, and the partition wall 122 layered one on top of another.

3. Effects

In the display panel 100a pertaining to Embodiment 2, the height of a portion of the top surface of the inter-layer insulation layer 118 above the mound portion 40, from the top face 1a of the substrate 1, is greater than the height of portions of the top surface of the inter-layer insulation layer 118 not above the mount portion 40, from the top face 1a of the substrate 1. Due to this, the height of the mask-holding member 4A, which is disposed on the inter-layer insulation layer 118 above the mound portion 40, from the top surface of the inter-layer insulation layer 118 is reduced compared to when the mount portion 40 does not exist. Further, while the mask-holding member 4A has such a reduced height, the height of the top portion 4a of the mask-holding member 4A, from the top face 1a of the substrate 1, is greater than the height of the top portion 122a of the partition wall 122 above where the mound portion 40 is not formed.

Due to the height of the mask-holding member 4A from the top surface of the inter-layer insulation layer 118 being reduced as such, the forming of the mask-holding member 4A does not require applying a large amount of high-viscosity material using a die coating method or the like.

Further, according to the manufacturing method of the display panel 100a pertaining to Embodiment 2, the forming of the mound portion 40 in the multi-layer wiring layer 2 and the forming of the mask-holding member 4A on the multi-layer wiring layer 2 can be incorporated in the process of forming the multi-layer wiring layer 2 and the organic electroluminescence elements 3 in the stated order above the substrate 1, instead of being performed as a separate process.

4. Variations

In Embodiment 2, the mound portion 40 is produced by layering, at the same position of the frame region 20, all layers forming the thin-film transistor in the display region 10.

However, the mound portion 40 need not necessarily include all layers of the thin-film transistor. That is, the mound portion 40 may not include one or more of such layers, as long as the height of the portion of the top surface of the inter-layer insulation layer 118 above the mound portion 40, from the top face 1a of the substrate 1, is greater than the height of portions of the top surface of the inter-layer insulation layer 118 not above the mound portion 40, from the top face 1a of the substrate 1.

Other

A sealing plate of glass or the like may be adhered onto a display face side of the display panel 100 in order to improve durability of the display panel 100. In the adhesion of such a sealing plate, a filling material made from an insulating material, such as a polyimide resin, an acrylic resin, or the like, is injected into a space between the display panel 100 and the sealing plate. Further, this filling material is sealed by providing a sealing material to a position at outermost side of the frame region 20 where the substrate 1 is exposed.

It should be noted that such filling material and sealing material would not correspond to the mask-holding members 4 of the display panel 100 pertaining to Embodiment 1. In specific, the mask-holding members 4 have a height on the order of 10 µm, and due to this, the top portions of the mask-holding members 4 would not come in contact with the sealing plat. Meanwhile, the filling material and the sealing material come in contact with both the display panel 100 and the sealing plate.

In addition, since the sealing material is for sealing the filling material. Thus, the sealing material is provided seamlessly around the display region. Meanwhile, the mask-holding members 4 of the display panel 100 pertaining to Embodiment 1 are separated from one another, in order to avoid positions where wiring is formed. Furthermore, the sealing material would be provided either on the substrate 1 or on the multi-layer wiring layer 2. When provided on the substrate 1, the sealing material further differs from the mask-holding members 4 of the display panel 100 pertaining to Embodiment 1, which are formed on the multi-layer wiring layer 2.

The filling material and the sealing material also differ from the mask-holding members 4A of the display panel 100a pertaining to Embodiment 2 on the same points as the mask-holding members 4 of the display panel 100 pertaining to Embodiment 1.

The present disclosure is applicable to a display panel used, for example, as a display panel for a mobile phone, a display element in a television, and so on, and to a manufacturing method therefor. Specifically, the present disclosure is expected to provide a display panel reducing the probability of problems occurring by mis-pressing to a multi-layer wiring layer occurring during a manufacturing process, and a manufacturing method therefor.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A display panel, comprising:
a substrate;
a multi-layer wiring layer over the substrate, the multi-layer wiring layer including a first power line receiving a first electric potential and a second power line receiving a second electric potential differing from the first electric potential;
organic electroluminescence elements over the multi-layer wiring layer, each of the organic electroluminescence elements including a first electrode electrically connected to the first power line, a second electrode electrically connected to the second power line, and an organic light-emitting layer sandwiched between the first electrode and the second electrode;
a partition wall over the multi-layer wiring layer and between the organic electroluminescence elements; and
a member over the multi-layer wiring layer, a height of a top portion of the member from a top face of the substrate being greater than a height of a top portion of the partition wall from the top face of the substrate, wherein
the multi-layer wiring layer includes a first portion and a second portion that, in a plan view of the substrate, surrounds the first portion,
the organic electroluminescence elements are arrayed on a top face of the first portion,
in the second portion, the first power line and the second power line intersect without direct contact,
the member is positioned on the second portion without overlapping at least one of the first power line and the second power line in the plan view of the substrate, and
the member is provided in plurality, with the plurality of members being separated from one another on the second portion.

2. The display panel according to claim 1, wherein
the member is positioned on the second portion without overlapping the first power line or the second power line in the plan view of the substrate.

3. The display panel according to claim 2, wherein
the multi-layer wiring layer further includes signal lines transporting signals for setting a brightness of the organic electroluminescence elements, and
the member is positioned on the second portion without overlapping the first power line, the second power line, or the signal lines in the plan view of the substrate.

4. The display panel according to claim 2, wherein
the multi-layer wiring layer further includes signal lines transporting signals for setting a brightness of the organic electroluminescence elements,
in the second portion, each of the signal lines intersects, without direct contact, the first power line and the second power line, and
the member is positioned on the second portion without overlapping where the first power line and the signal lines intersect without direct contact, and where the second power line and the signal lines intersect without direct contact, in the plan view of the substrate.

5. The display panel according to claim 1, wherein
the multi-layer wiring layer further includes thin-film transistors that control light emission by the organic electroluminescence elements and that each include a plurality of layers disposed one on top of another,
the multi-layer wiring layer further includes a mound portion below the member, the mound portion including the plurality of layers included in the thin-film transistors and having a flat top portion, and
in the second portion, a height of a top face of the multi-layer wiring layer from the top face of the substrate is greater where the mound portion is located than where the mound portion is not located.

6. The display panel according to claim 1, wherein
in the second portion, the first power line includes a first wiring portion that, in the plan view of the substrate, extends linearly from the first portion,
in the second portion, the second power line includes a second wiring portion that, in the plan view of the substrate, extends linearly from the first portion in parallel to the first wiring portion, and a third wiring portion that is connected to the second wiring portion and that, in the plan view of the substrate, extends orthogonal to the second wiring portion, and
the first wiring portion and the third wiring portion are on different layers of the multi-layer wiring layer and intersect without direct contact in the second portion.

7. The display panel according to claim 6, wherein
in the second portion, the first power line includes a fourth wiring portion that is connected to the first wiring portion and that, in the plan view of the substrate, extends orthogonal to the first wiring portion,
in the second portion, the second power line includes a fifth wiring portion that is connected to the third wiring portion and that, in the plan view of the substrate, extends in parallel to the second wiring portion, and the fourth wiring portion and the fifth wiring portion are disposed on different layers of the multi-layer wiring layer and intersect without direct contact in the second portion.

8. The display panel according to claim 1, wherein each of the plurality of members is positioned at a boundary between two pixels of the display panel.

9. The display panel according to claim 1, wherein each of the plurality of members is positioned at a vicinity of a boundary of a pixel of the display panel.

10. A manufacturing method for a display panel on which a plurality of organic electroluminescence elements each including a first electrode, a second electrode, and an organic light-emitting layer sandwiched between the first electrode and the second electrode are arrayed, the manufacturing method comprising:

forming a multi-layer wiring layer over a substrate, the multi-layer wiring layer including a first power line receiving a first electric potential and a second power line receiving a second electric potential differing from the first electric potential;

forming the first electrode over the multi-layer wiring layer to be electrically connected to the first power line, and forming a partition wall over the multi-layer wiring layer, the partition wall defining a region where the organic light-emitting layer is to be formed;

forming a member over the multi-layer wiring layer, a height of a top portion of the member from a top face of the substrate being greater than a height of a top portion of the partition wall from the top face of the substrate;

forming the organic light-emitting layer in the region defined by the partition wall; and disposing a mask having an aperture corresponding at least to the region defined by the partition wall in contact with the member, and forming a functional layer at least in the region defined by the partition wall through the aperture, wherein the multi-layer wiring layer includes a first portion and a second portion that, in a plan view of the substrate, surrounds the first portion, the organic electroluminescence elements are arrayed on a top face of the first portion, in the second portion, the first power line and the second power line intersect without direct contact, the member is formed to be positioned on the second portion without overlapping at least one of the first power line and the second power line in the plan view of the substrate, and the member is provided in plurality, with the plurality of members being separated from one another on the second portion.

11. A display panel, comprising:
a substrate;
a multi-layer wiring layer over the substrate, the multi-layer wiring layer including a first power line receiving a first electric potential and a second power line receiving a second electric potential differing from the first electric potential;

organic electroluminescence elements over the multi-layer wiring layer, each of the organic electroluminescence elements including a first electrode electrically connected to the first power line, a second electrode electrically connected to the second power line, and an organic light-emitting layer sandwiched between the first electrode and the second electrode;

a partition wall over the multi-layer wiring layer and between the organic electroluminescence elements; and a member over the multi-layer wiring layer, a height of a top portion of the member from a top face of the substrate being greater than a height of a top portion of the partition wall from the top face of the substrate, wherein the multi-layer wiring layer includes a first portion and a second portion that, in a plan view of the substrate, surrounds the first portion, the organic electroluminescence elements are arrayed on a top face of the first portion, in the second portion, the first power line and the second power line intersect without direct contact, the member is positioned on the second portion without overlapping at least one of the first power line and the second power line in the plan view of the substrate, in the second portion, the first power line includes a first wiring portion that, in the plan view of the substrate, extends linearly from the first portion, and includes a fourth wiring portion that is connected to the first wiring portion and that, in the plan view of the substrate, extends orthogonal to the first wiring portion, in the second portion, the second power line includes a second wiring portion that, in the plan view of the substrate, extends linearly from the first portion in parallel to the first wiring portion, includes a third wiring portion that is connected to the second wiring portion and that, in the plan view of the substrate, extends orthogonal to the second wiring portion, and includes a fifth wiring portion that is connected to the third wiring portion and that, in the plan view of the substrate, extends in parallel to the second wiring portion, the first wiring portion and the third wiring portion are on different layers of the multi-layer wiring layer and intersect without direct contact in the second portion, and the fourth wiring portion and the fifth wiring portion are disposed on different layers of the multi-layer wiring layer and intersect without direct contact in the second portion.

* * * * *